(12) United States Patent
Barash

(10) Patent No.: US 7,434,150 B1
(45) Date of Patent: Oct. 7, 2008

(54) METHODS, CIRCUITS, ARCHITECTURES, SOFTWARE AND SYSTEMS FOR DETERMINING A DATA TRANSMISSION ERROR AND/OR CHECKING OR CONFIRMING SUCH ERROR DETERMINATIONS

(75) Inventor: Dror Barash, Rannana (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 484 days.

(21) Appl. No.: 10/795,003

(22) Filed: Mar. 3, 2004

(51) Int. Cl.
*H03M 13/09* (2006.01)
(52) U.S. Cl. .................................. 714/807
(58) Field of Classification Search ............... 714/807
See application file for complete search history.

(56) References Cited

U.S. PATENT DOCUMENTS

| | | | | |
|---|---|---|---|---|
| 4,596,981 A | * | 6/1986 | Ueno et al. | 340/825.2 |
| 4,944,038 A | * | 7/1990 | Hardy et al. | 370/454 |
| 5,050,165 A | * | 9/1991 | Yoshioka et al. | 370/401 |
| 5,138,316 A | | 8/1992 | Konishi | |
| 5,164,943 A | * | 11/1992 | DeSouza et al. | 714/703 |
| 5,410,546 A | | 4/1995 | Boyer et al. | |
| 5,550,542 A | | 8/1996 | Inoue | |
| 5,610,921 A | * | 3/1997 | Christensen | 370/395.4 |
| 5,619,516 A | | 4/1997 | Li et al. | |
| 5,638,370 A | * | 6/1997 | Seconi et al. | 370/466 |

(Continued)

FOREIGN PATENT DOCUMENTS

WO 00/65791 A1 11/2000

WO 02/093753 A1 11/2002

OTHER PUBLICATIONS

Dror Barash; "Methods, Architectures, Circuits, Software and Systems for Transmission Error Determination"; U.S. Appl. No. 10/690,780, filed Oct. 21, 2003.

(Continued)

*Primary Examiner*—Stephen M. Baker

(57) ABSTRACT

Methods, circuits, architectures, and systems for error detection in transmitted data. The method generally includes the steps of (a) performing an error checking calculation on the transmitted data and appended error checking code; (b) determining the calculated error checking code state; and (c) if it has a predetermined state, indicating that there is no error in the transmitted data. The circuitry generally comprises (1) an error checking code calculation circuit configured to calculate error checking code on the transmitted data and the appended error checking code; (2) a vector selector configured to select one of a plurality of error checking vectors; and (3) a logic circuit configured to determine the calculated error checking code state and, if it has a predetermined state, indicate that there is no error in the transmitted data. The software generally includes a set of instructions configured to implement or carry out the present method. The architectures and/or systems generally include those that embody one or more of the inventive concepts disclosed herein. In the present invention, an error checking calculation is performed on error checking code transmitted with the data. If the transmitted data and error checking code are error-free, the error checking calculation gives a result having a known and/or predetermined state. This technique enables one to confirm or determine that the data transmission was error-free without use of or need for a wide, complicated comparator, thereby reducing the chip area dedicated to error detection, increasing the utilization efficiency of the circuitry on the chip, and reducing power consumption.

68 Claims, 10 Drawing Sheets

U.S. PATENT DOCUMENTS

| | | | |
|---|---|---|---|
| 5,724,368 A | | 3/1998 | Zook |
| 5,761,465 A * | | 6/1998 | Nimishakvi et al. ......... 710/316 |
| 5,778,013 A * | | 7/1998 | Jedwab ....................... 714/807 |
| 5,901,250 A | | 5/1999 | Ohara |
| 5,935,269 A * | | 8/1999 | Kodama et al. ............. 714/781 |
| 5,951,707 A | | 9/1999 | Christensen et al. |
| 6,000,053 A | | 12/1999 | Levine et al. |
| 6,009,547 A | | 12/1999 | Jaquette et al. |
| 6,029,186 A * | | 2/2000 | DesJardins et al. .......... 708/492 |
| 6,061,820 A | | 5/2000 | Nakakita et al. |
| 6,172,626 B1 | | 1/2001 | McDonnell et al. |
| 6,185,207 B1 * | | 2/2001 | LaBerge et al. ............. 370/392 |
| 6,208,645 B1 * | | 3/2001 | James et al. ................ 370/389 |
| 6,223,320 B1 | | 4/2001 | Dubey et al. |
| 6,233,251 B1 | | 5/2001 | Kurobe et al. |
| 6,269,464 B1 * | | 7/2001 | Boussina et al. ............. 714/752 |
| 6,324,669 B1 * | | 11/2001 | Westby ....................... 714/805 |
| 6,357,032 B1 * | | 3/2002 | Plotz et al. .................. 714/758 |
| 6,370,667 B1 | | 4/2002 | Maki |
| 6,412,093 B1 | | 6/2002 | Argentati et al. |
| 6,424,650 B1 * | | 7/2002 | Yang et al. .................. 370/390 |
| 6,519,737 B1 * | | 2/2003 | Derby ......................... 714/781 |
| 6,560,742 B1 * | | 5/2003 | Dubey et al. ................ 714/757 |
| 6,570,884 B1 * | | 5/2003 | Connery et al. ............. 370/419 |
| 6,598,200 B1 | | 7/2003 | Greenwood et al. |
| 6,625,689 B2 * | | 9/2003 | Narad et al. ................. 711/110 |
| 6,738,946 B1 * | | 5/2004 | Irvin ........................... 714/776 |
| 6,754,870 B2 * | | 6/2004 | Yoshida et al. .............. 714/758 |
| 6,763,492 B1 * | | 7/2004 | Hurt et al. ................... 714/752 |
| 6,766,493 B1 * | | 7/2004 | Hoffman et al. ............. 714/785 |
| 6,795,946 B1 * | | 9/2004 | Drummond-Murray et al. ........................... 714/781 |
| 6,904,558 B2 * | | 6/2005 | Cavanna et al. ............. 714/758 |
| 6,931,581 B1 * | | 8/2005 | Cassiday et al. ............. 714/758 |
| 6,934,730 B2 | | 8/2005 | Direen, Jr. et al. |
| 7,096,399 B2 * | | 8/2006 | Pieczul ....................... 714/748 |
| 7,103,822 B2 * | | 9/2006 | Glaise et al. ................ 714/758 |
| 2001/0037481 A1 | | 11/2001 | Suzuki et al. |
| 2002/0053059 A1 | | 5/2002 | Hara et al. |
| 2002/0066059 A1 | | 5/2002 | Hara et al. |

OTHER PUBLICATIONS

Dror Barash; "Methods, Architectures, Circuits, Software and Systems for CRC Determination"; New U.S. Patent Application, filed on Mar. 3, 2004.

Dror Barash; "Methods, Architectures, Circuits, and Systems for Transmission Error Determination"; U.S. Appl. No. 12/060,836; Filing Date: Apr. 1, 2004.

Chris Borrelli; IEEE 802.3 Cyclic Redundancy Check; Xilinx; XAPP209 (v1.0); Mar. 23, 2001; 8 pages; www.xilinx.com.

"Fabric Access Processor"; Prestera-FX930, 98FX930; 2 pages; www.marvell.com; Marvell Semiconductor, Sunnyvale, California.

9-Port/12-Port Crossbar Switch Fabric; Prestera-FX9110/FX9210, 98FX9110/98FX9210; 2 pages; www.marvell.com; Marvell Semiconductor, Sunnyvale, California.

"64-Port Fabric Element"; Prestera-FX9130, 98FX9130; 2 pages; www.marvell.com; 2 pages; Marvell Semiconductor, Sunnyvale, California.

"Stack Fabric Processor with Integrated SERDES"; Prestera-FX902, 98FX902; Marvell Semiconductor, Sunnyvale, California.

"Mesh Fabric Processor with Integrated SERDES"; Prestera-FX900, 98FX900; 2 pages; Marvell Semiconductor, Sunnyvale, California.

"Marvell Introduces Complete Multi-Service Fabric Chipset, Enabling System Vendors to Develop Service Platforms and Extend Product Life Cycles"; Marvell News and Events; 3 pages; Marvell Press and Investor News, Sunnyvale, California, Jun. 23, 2003; http://www.marvell.com/press/pressNewsDisplay.do?releaseID=362.

"Marvell Rapidly Accelerates Gigabit to the Desktop with the World's Highest Density Ethernet Switching Chipset"; Marvell News and Events; 4 pages; Marvell Press and Inventors News; Sunnyvale, California, Apr. 29, 2002; http://www.marvell.com/press/pressNewsDisplay.do?releaseID=46.

* cited by examiner

METHODS, CIRCUITS, ARCHITECTURES, SOFTWARE AND SYSTEMS FOR DETERMINING A DATA TRANSMISSION ERROR AND/OR CHECKING OR CONFIRMING SUCH ERROR DETERMINATIONS

RELATED APPLICATION(S)

The present application may be related to the co-pending, commonly-owned applications entitled "Methods, Architectures, Circuits, Software and Systems for Transmission Error Determination" (Ser. No. 10/690,780, filed on Oct. 21, 2003; and/or "Method(s), Architecture(s), Circuits, Software and Systems for CRC Determinations" (Ser. No. 10/794,496, filed on Mar. 3, 2004; the disclosures of which are incorporated herein by reference in their entireties.

FIELD OF THE INVENTION

The present invention generally relates to the field of data transmission error determinations. More specifically, embodiments of the present invention pertain to methods, architectures, circuits, software and systems for determining a data transmission error and/or checking or confirming such an error determination.

DISCUSSION OF THE BACKGROUND

Cyclic redundancy checking ("CRC") is a well-known, conventional technique for finding data transmission errors. Typically, CRC is performed "on-the-fly" by hardware or logic circuitry, usually on serial data received in a device or system. Cyclic redundancy code (a result of a CRC determination) is typically generated at the data source, and is typically included in the header of a data packet or frame.

As shown in FIG. 1A, one type of data packet 10 comprises a plurality of words Data0 12 through DataN 20, where N is an integer of any length conforming to a conventional network data communications protocol. Each data word Data0-DataN contains 32 bits of data, consistent with the art-recognized meaning of "word" as it applies to data transmission. To ensure that data packet 10 was transmitted successfully (i.e., without errors), a CRC calculation may be performed on the data therein. Data packet 10 may further comprise non-data information, such as a header and/or trailer of fixed or variable length, depending on the network and/or system. However, since headers and trailers are not data, they are not included in a CRC determination.

Since data packet 10 contains data words 12-20 each having the same length, a single CRC circuit block can perform the CRC calculation. FIG. 1B shows conventional receiver circuit blocks configured to process incoming data and perform a CRC calculation. For example, receiver block RX 52 receives serial data from a source device in a network. Such data is typically binary or digital data. Receiver block RX 52 is generally configured to recover a clock signal from the incoming serial data packet 10, and may be further configured to deserialize the packet (i.e., convert the serial data bits to parallel data bits). Header detection and removal block 54 receives the data packet 10 from receiver block 52 on serial or parallel bus 56, and detects and removes non-data information (such as a header) from the packet. The data words Data0 12 through DataN 20 are transmitted to CRC block 60 for the CRC calculation, and the non-data information is generally sent to another functional block (such as a decoder or data processor) for subsequent processing. Since CRC block 60 performs a CRC calculation one word at a time, CRC block 60 generally requires at least N clock cycles to calculate CRC on data words Data0 12 through DataN 20.

Conventionally, the wider the bus(ses) and the greater the number of parallel data bits that can be processed simultaneously, the faster such data can be processed. Thus, CRC circuits have been developed to calculate a CRC on more than one word of data at a time (see, e.g., U.S. patent application Publication Nos. 2002/0053059 and 2002/0066059). However, since the data packet 10 can include any number of data words and/or data bits that conform to a conventional network data communications protocol, the "multiple data word" approach often results in the last word in data packet 10 having a length less than the full multiple word length.

FIG. 2A shows an example of a data packet 100, comprising a plurality of multiple word length data lines Data0 12 through DataN-1 108 and remainder line DataN 110. In this example, each of multiple word length data lines, Data0 102 through DataN-1 108 has a length of $2^m$ bits, where $m \geq 6$. In a typical approach, m=7, and as a result, each of data lines Data0 102 through DataN-1 108 also has a length of four (4) words. However, remainder line DataN 110 may have a length of from 1 data bit to one bit less than the full multiple word length. In the typical "multiple word" data line approach where m=7, remainder line DataN 110 may have a length of from 1 to 3 data words. (Note that, in the case where m=7, remainder line DataN 110 cannot have a length of zero or four data words, although data packet 100 can contain 4*N or 4*(N-1) data words. In such cases, there simply is no remainder).

Previous approaches to calculating a CRC on data units having a remainder line (i.e., where the packet contains a number of data bits that is not an integer multiple of the CRC calculating circuitry width) have resulted in architectures containing multiple sets of CRC hardware. One set of CRC hardware operated on the full length, multiple-word blocks or lines of data, and one or more other sets of CRC hardware operated on remainder data lines having a length less than the full, multiple-word length. In some cases, such as that shown in FIG. 2B, multiple CRC calculation circuit blocks 162, 164, 166, etc. are added to process remainders of variable lengths, in which the additional CRC calculation circuit blocks were configured to process data of different fixed lengths, and the appropriate individual CRC calculation circuit blocks of different fixed widths are selected to process data of a given length less than the full, multiple-word fixed length. The approach becomes more complicated as data processing widths increase.

An example of a simplified version of such a CRC architecture 150 is shown in FIG. 2B. Serial data is received by receiver 152 and is transferred to a logic/processing block 154 that detects and removes the header (and possibly other non-data information) from the data stream. (Other functional circuit blocks of architecture 150 are not shown for purposes of clarity in explaining the background.) The output of block 154 is input into a 1:m demultiplexer (or switch) 158, which selects one of outputs 161 . . . 163, 165 or 167 for processing by $2^m$ bit-wide CRC calculator 160 . . . 4 bit CRC calculator 162, 2 bit CRC calculator 164, and 1 bit CRC calculator 166, respectively, depending on the state of control signal CONTROL. Depending on the value of m, additional CRC calculator blocks will be present to process data of successive power-of-2 bit lengths between 4 and $2^m$. The state of control signal CONTROL is determined by logic circuitry that detects the existence of remainder 110 and, optionally, determines the number of data bits in remainder 110. Most of the time, data lines 102-110 are received by demultiplexer 158, and control signal CONTROL selects bus 165 for transferring data lines 102-108 to $2^m$ bit-wide CRC calculator 160, which can calculate a CRC on multiple data words in a single clock cycle. However, when remainder logic circuitry detects a remainder 110, control signal CONTROL changes state and selects one of busses 163, 165, 167 or a bus (not shown) between bus 163 and bus 161 for transferring all or part of data line 110 to data word CRC calculator 170, which is configured to calculate a CRC on one data word in one clock cycles. When remainder 110 contains a number of bits that is not a power of 2, it can take longer to calculate a CRC on remainder 110 than on a full-length, multiple-word data line.

While providing some improvement over the approach of FIGS. 1A-1B in calculation time, the approaches of FIGS. 2A-2B in inefficient in terms of circuit use and/or chip area. A significant amount of chip real estate is dedicated to circuitry that is used infrequently or, in some cases, not at all (e.g., where a transmission protocol places restrictions on the number of words or bits in the data packet). Such architectures also unnecessarily consume power to keep all of the CRC circuitry active, even when it is not in use. In many cases, some bus lengths to and from second, third and/or fourth CRC blocks are relatively long, and thus consume incrementally greater power when transmitting data or even staying active, in comparison with the main (e.g., $2^m$ bit) CRC block.

Needs therefore exist to maximize the operational efficiency and the functional circuit area efficiency of CRC circuitry and/or to further improve the CRC calculation speed, to keep up with ever-increasing demands for increased network speeds, smaller chip and board sizes and reduced power consumption.

SUMMARY OF THE INVENTION

Embodiments of the present invention relate to circuitry, architectures, systems and methods for determining if a data and/or information transmission error has occurred. The method generally comprises the steps of (a) performing an error checking calculation on (i) the transmitted data and (ii) error checking code calculated thereon and appended thereto, to provide a calculated error checking result; (b) determining a state of the calculated error checking result; and (c) if the calculated error checking result has a predetermined state, indicating that there is no error in the transmitted data. The circuitry generally comprises (1) an error checking code calculation circuit configured to calculate error checking code on the transmitted data and the appended error checking code; (2) a vector selector configured to select one of a plurality of error checking vectors, the plurality of error checking vectors comprising an initial vector and an error checking code feedback vector; and (3) a logic circuit configured to determine a state of the calculated error checking code and, if the calculated error checking code has a predetermined state, indicate that there is no error in the transmitted data. The software generally includes a set of instructions configured to implement or carry out the present method. The architectures and/or systems generally comprise those that include a circuit embodying one or more of the inventive concepts disclosed herein or that are configured to practice one or more of the inventive methods or processes described herein.

In the present invention, an error checking calculation is performed on error checking code transmitted with the data. If the transmitted data and error checking code are error-free, the error checking calculation gives a result having a known and/or predetermined state. This technique enables one to confirm or determine that the data transmission was error-free without use of or need for a wide and/or complicated comparator, thereby reducing the chip area dedicated to error detection, increasing the utilization efficiency of the circuitry on the chip, and reducing power consumption.

In further embodiments, the present invention advantageously provides CRC circuitry and a CRC architecture with (i) increased calculation speed and (ii) improved operational and functional circuit area efficiencies, thereby providing increased network speeds, smaller chip and IC package sizes, and reduced power consumption, thereby enabling smaller board designs and reduced power consumption and heat generation in systems containing circuitry implementing the present invention.

These and other advantages of the present invention will become readily apparent from the detailed description of preferred embodiments below.

DETAILED DESCRIPTION OF THE PREFERRED EMBODIMENTS

Figure 1A:
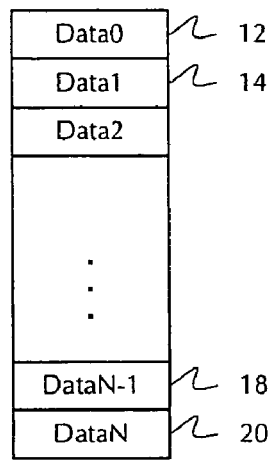
FIG. 1A is a diagram showing a conventional data packet for a network.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within the computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer of data processing system, or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the following groups of terms "data," "data stream," "waveform" and "information" may be used interchangeably, but the individual terms are also generally given their art-recognized meanings:

"connected to," "coupled with," "coupled to," "communicatively coupled to," and "in communication with;"
"known." "predetermined" and "predefined;"
"circuit," "architecture," "circuit block" and "function(al) block;" and
"determine," "detect," "calculate," "check" and "find" (and grammatical variations thereof).

The acronym "CRC" refers to cyclic redundancy code, a cyclic redundancy check (e.g., the performance of a cyclic redundancy code calculation, or the result of performing such a calculation) and/or the act of calculating cyclic redundancy code or performing a cyclic redundancy check (sometimes known as "cyclic redundancy checking"), depending on the context of its use.

The present invention concerns methods, circuits, architectures and systems for determining if a data transmission error has occurred and/or checking such data transmission error determinations. The method generally comprises the steps of (a) performing an error checking calculation on (i) the transmitted data and (ii) appended error checking code calculated on the transmitted data to provide a calculated error checking result; (b) determining a state of the calculated error checking result; and (c) if the calculated error checking result has a predetermined state, indicating that there is no error in the transmitted data.

A further aspect of the invention concerns a circuit and/or architecture for determining data transmission errors and/or checking such error determinations, generally comprising (1) an error checking code calculation circuit configured to calculate error checking code on the transmitted data and the appended error checking code; (2) a vector selector configured to select one of a plurality of error checking vectors, the plurality of error checking vectors comprising an initial vector and an error checking code feedback vector; and (3) a logic circuit configured to determine a state of the calculated error checking code and, if the calculated error checking code has a predetermined state, indicate that there is no error in the transmitted data. Even further aspects of the invention concern a system for determining transmission errors in digital information, generally comprising the present circuit and/or architecture, and software configured to implement and/or encode one or more of the methods disclosed herein. The invention, in its various aspects, will be explained in greater detail below with regard to exemplary embodiments.

An Exemplary Method of Cyclic Redundancy Checking

In one aspect, the present invention relates to a method of determining an error in transmitted data, comprising the steps of (a) performing an error checking calculation on (i) the transmitted data and (ii) appended error checking code calculated on the transmitted data to provide a calculated error checking result; (b) determining a state of the calculated error checking result; and (c) if the calculated error checking result has a predetermined state, indicating that there is no error in the transmitted data. The method may further include the conditional step of indicating that there is an error in the transmitted data if the calculated error checking result does not have the predetermined state. Typically, the appended error checking code is appended to the sequential and/or temporal end of the transmitted data (as opposed to its sequential and/or temporal beginning) prior to the transmitted data being transmitted. In one embodiment, the error checking calculations comprise cyclic redundancy check (CRC) calculations.

The appended error checking code calculated on the transmitted data is generally calculated and appended to the data prior to transmission. Thus, it may be convenient at times herein to characterize or refer to the transmitted data and appended error checking code as "received data" and "received error checking code," respectively, after it has been received by a receiver. Typically, the received data and received error checking code will be identical to the transmitted data and appended error checking code prior to its transmission. However, in some instances, the received data and received error checking code will be substantially identical to the transmitted data and appended error checking code prior to its transmission, except for one or more errors therein resulting from the transmission of the transmitted data and appended error checking code and/or the processing of the transmitted data and appended error checking code by the receiver.

The digital data is generally transmitted in units and generally has a unit format that is conventionally used for data transmission, such as a packet, a frame or a page. As is known in the art, packets, frames and pages may include both data and non-data information (as discussed below). However, as discussed above, CRC calculations are conventionally performed only on data, so any non-data information in a packet, frame, page or other data-containing unit of information is typically removed prior to performing error checking calculations. Naturally, the digital data may comprise a series or plurality of such data units, but the method is generally performed on an individual unit (and ideally, on each such unit).

In a preferred embodiment, the transmitted unit of data is partitioned into one or more full data lines and a remainder. Thus, a full data line is generally smaller than a unit of data. A remainder generally has a length of at least 1 data bit and less than the length of a full data line, but in one case (described below), the reminder can have a length of zero bits. However, each full data line may comprise 2 or more data blocks, each having a second fixed length. In such a case, a data block is necessarily smaller than a full data line. In one embodiment, a data block is a (1/q) integer divisor of a data line, where q is 2 or more, preferably 4 or more. In various implementations, q is 4, or alteratively, a data block consists of a data word (32 bits).

Figure 3A:
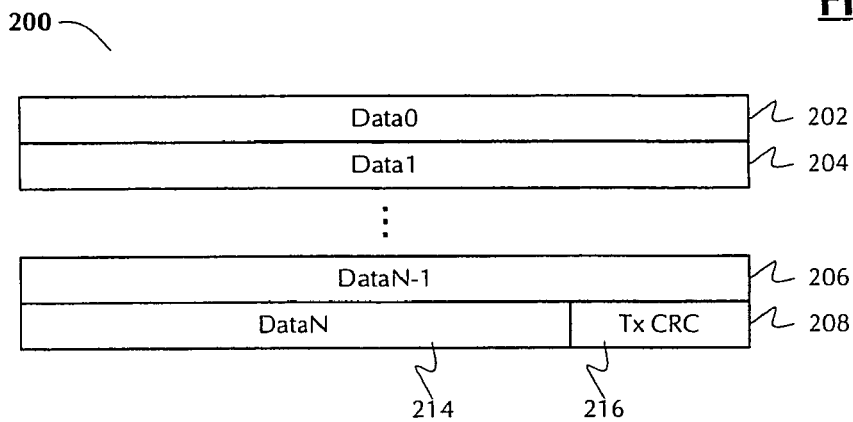
FIGS. 3A-3C are diagrams showing a first series of exemplary embodiments of the present data alignment architecture for calculating a CRC and determining whether there has been a transmission error.
Figure 3B:
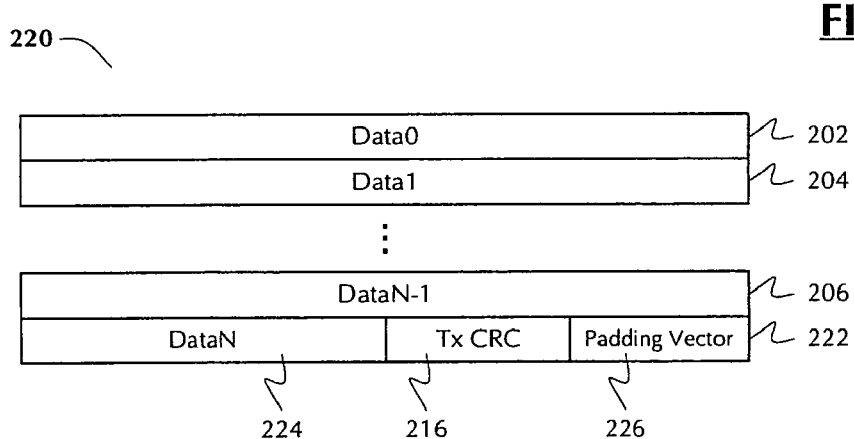
Figure 3C:
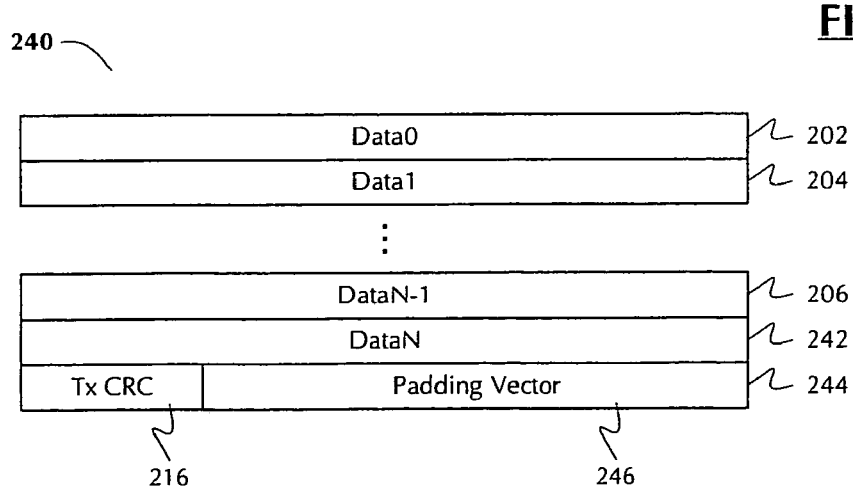

FIGS. 3A-3C show a series of examples of the present data alignment architecture for calculating error checking code and determining whether there has been a transmission error, in which a transmitted data unit is partitioned into a series of full data lines 202 . . . 206 and a last line (208 in FIG. 3A, 222 in FIG. 3B, and 244 in FIG. 3C), in which the remainder has a length of from 0 bits to a full data line minus the appended error checking code. Referring now to FIG. 3A, a unit of digits data 200 is shown, comprising a plurality of full data lines 202-206 and a last line 208. Each of data lines 202-208 has a fixed length (although this is not required for certain benefits of the present invention, as will be explained below). In the embodiment shown in FIG. 3A, this fixed length is $2^m$ bits, where m is preferably an integer of from 3 to 10, more preferably of from 5 to 8. In one implementation, m is 7.

Last line 208 generally comprises a data portion 214 (e.g., "DataN") and the appended error checking code calculated on the transmitted data (e.g., "Tx CRC") 216. In this example, data portion 214 has a length equal to the full data line length minus the length of the appended error checking code 216. In one embodiment, the error checking code appended to the transmitted data (e.g., a packet or other unit of data) has a length of p bits, where p is an integer of from 8 to 128. In various implementations, p is 8, 16, 32, 64 or 128. Thus, the present method may further comprise the step of partitioning the transmitted data and the appended error checking code into (i) one or more data lines and (ii) a last line comprising the transmitted error checking code.

The present invention takes advantage of a general principle of error checking code calculations, in that an error checking code calculation performed or iterated on the error checking code itself as data, using the calculated error checking code as an iterated error checking vector, gives a known and/or predictable result. For example, a CRC calculation performed on the combination of (i) a unit of data and (ii) the CRC on that unit of data given an "all zeros" result (i.e., 000 . . . 000). Thus, appending a CRC on a unit of data prior to its transmission, then calculating a CRC on the combined data and appended CRC, should give an "all zeros" CRC if there have been no errors in data transmission or receiver processing (at least through the step of calculating a CRC). Of course, a complementary approach may be devised (e.g., depending on the initial vector, the CRC calculating logic, and the post-calculation processing logic used). Therefore, the predetermined state in the present method may be selected from the group consisting of all zeros and all ones.

FIG. 3B shows unit of digital data 220, comprising a plurality of full data lines 202-206 and a last line 222. The data line 202-206 are essentially the same as in FIG. 3A, but last line 222 generally comprises a data portion 224 (e.g., "DataN"), appended error checking code 216, and padding vector 226. Data portion 224 in this example generally has a length of from one data bit to less than a full data line length minus the length of the appended error checking code 216, and (like data portion 214 in FIG. 3A) represents the final portion of transmitted data, temporally and/or sequentially.

As described above, one disadvantage of conventional CRC methods and circuits is that separate circuits are used to perform CRC calculations on data blocks of different sizes. That can be a very inefficient process, but has generally been necessary in order to process units of data having a bit length that is not a multiple of the width of the CRC calculator. However, in one aspect, the present invention involves a method for performing CRC calculations on blocks of data having a uniform bit length, thereby enabling CRC on digital data using a single CRC calculating circuit or circuit block. A general approach for this technique is described in detail in copending application Ser. No. 10/794,496, filed on Mar. 3, 2004, the relevant portions of which are incorporated herein by reference. However, adaptations thereof suitable for the present invention will be described with reference to FIGS. 3B-3C and FIGS. 4A-4B.

Generally, it is advantageous to calculate error checking code on data in lines having a known and/or fixed length (e.g., data lines 202-206 in FIGS. 3A-3B). This technique enables use of a single CRC calculating circuit or circuit block to calculate the error checking code on the data. As a result, and now referring to FIG. 3B, the present invention may add a padding veto 226 to last line 222 so that every data line on which error checking code is calculated has the same length. Thus, where the remainder (e.g., data portion 224) has a length less than a full data line length minus the appended error checking code length, a padding vector 226 having a length sufficient to generate a final, padded data line having the known and/or fixed length (e.g., line 222) may be added. Thus, the last line may further comprise a padding vector, and optionally, the method may further comprise removing a non-data portion of the transmitted information unit comprising the transmitted data (except for the appended error checking code), and inserting the padding vector after the appended error checking code. In addition, the checking step of the present method may comprise checking each of the data lines (including the first line) and the last line with common error checking circuitry.

In one preferred embodiment, the transmitted information unit may comprise a data packet. As is known in the art, depending on the application, packets may have a variable length or a fixed length. In one implementation, the packets may comprise $(2^x \cdot y)+z$ words, wherein $2^x$ is the number of words in a line of data in the packet, x is an integer of from 0 to 4 (preferably from 1 to 3, and in one embodiment, 2), y is the number of lines of data in the packet (generally $\geq 1$, preferably $\geq 3$, more preferably $\geq 5$, and most preferably $\geq 7$), and z is an integer of $2^x$ or less than $2^x-1$. In such an implementation, the appended error checking code has a length of 1 data word. Thus, in the present method, where the data lines each comprise a plurality of data blocks, and the fixed length of each data block is an integer divisor of the fixed length of a data line, the appended error checking code has a third length comprising an integer multiple of the second fixed length, the integer multiple being the same as or less than the integer divisor. In one implementation, the appended error checking code has the same length as a data block.

In this "fixed packet" implementation, when z is anything other than $2^x-1$, the length of the padding vector 226 is $(2^x-z-1)$ words. A data word generally comprises four (4) bytes of data, but the number of data bytes that make up on a data word may very, depending on the application. Thus, the fixed length of the data blocks making up a data line generally consist of $2^n$ bits, where n is an integer of from 3 to 6; preferably, n is 5.

In another preferred implementation, the packets have a fixed length, in which case both y and z are constant values from packet to packet. When y and z are constant, the same padding vector 226 can be inserted into the last line for each packet. When constant values for y and z are known at or before the time of circuit design, the known padding vector 250 can be implemented in hardware. However, even when the packets have a variable length, the number of words in the remainder can be determined accurately in accordance with conventional techniques from information indicating whether the total number of data words in the packet (or other form of data unit) is an odd number or an even number.

Where packets may have a variable length, the number of excess data words and/or bits in the packet (i.e., those words and/or bits that are not present in sufficient number to complete a full line in combination with the appended error checking code 216) may be determined, and an appropriate padding vector 226 may be selected based on the determination. For example, a conventional look-up or hash table can store padding vectors of various lengths, and the addresses of the look-up or hash table can be correlated to the outcome of the excess data word determination. For example, in an application where data is known to be transmitted in words only, the excess number of words can be determined (e.g., 0, 1, 2, . . . $2^x-1$) and a complementary number of padding words (minus 1 word for the appended error checking code 216) can be added to the excess data words to form a complete, padded last line 222. Therefore, the present method may further comprise the step of selecting the padding vector based on information about the length of, or number of data blocks in, the remainder.

The hash table or look-up table may comprise an array of non-volatile data bit storage elements (e.g., mask- or laser-programmed ROM, EPROM, EEPROM or flash memory). The table may have a series of addresses corresponding to unique padding vectors of differing lengths, or logic may be configured to choose one or more sections of a full line of all zero bits to provide an appropriate padding vector 226 (e.g., a one-line-long shift register stores a series of binary zeros, an appropriate length of which is shifted out in response to an instruction from the logic). A padding vector of all zero bits is preferred in the embodiment of FIG. 3B because an iteration of an error checking code calculation on an "all zeros" block of data generally does not change the value of the overall error checking code calculation (particularly in a CRC calculation). However, the padding vector may have any value that has a known or predetermined effect on the CRC calculation result.

Logic elsewhere in the receiver may be configured to determine whether the unit of digital data includes a remainder, and if so, the length of (e.g., how many data words are in) the remainder. Such logic may comprise a counter configured to count the number of bits, bytes or words of data in a transmitted information unit, or it may comprise a simple decoder that decodes appropriately designated "remainder length" information bits in the non-data information transmitted with the unit of data. Thus, the present method may further comprise the step(s) of determining whether the unit of digital data includes the remainder and/or determining the length of, or number of data blocks or words in, the remainder.

In various implementations, the packet or frame conforms to a conventional network protocol and/or protocol stack, such as OSI, ASN.1 (Abstract Syntax Notation 1), BER (Basic Encoding Rules), CMIP (Common Management Information Protocol), CMIS (Common Management Information Services), X.400 (Message Handling System, or MHS), X.500 (Directory Service), ANSI/NISO Z39.50, TCP, IP and/or TCP/IP. In addition to CRC information, the packet or frame header may further include a start-of-packet (SOP) sequence, source and/or destination addresses, and/or information on the packet or frame format and/or amount of data (e.g., the number of data words) in the packet or frame. In one such embodiment, the transmitted information unit (including the unit of data) comprises a packet.

Figure 2A:
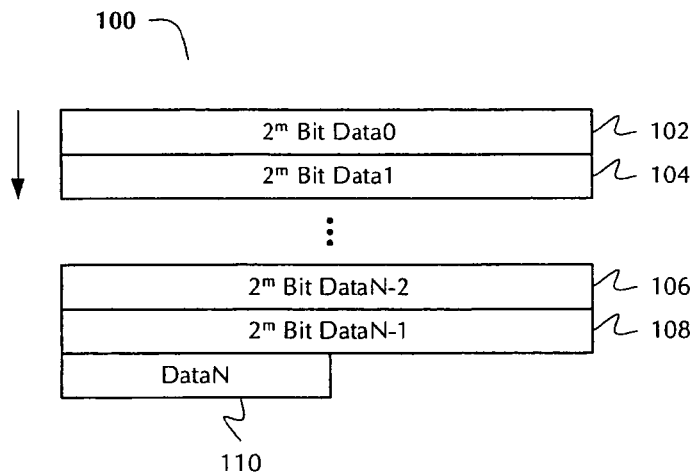
FIG. 2A is a diagram showing an alternative conventional network data packet.

FIG. 3C shows a data alignment architecture in which the remainder has a length of zero bits. In such a case, the unit of digital data 240 comprises a plurality of full data lines 202, 204, 206 and 242, and a last line 244. The full data lines 202-206 are essentially the same as in FIG. 3A, but full data line 242 (e.g., "DataN") represents the final portion of transmitted data, temporally and/or sequentially, and last line 244 generally comprises appended error checking code 216 and padding vector 246. In this case, padding vector 246 has a length of the full data line length minus the length of appended error checking code 216. While this particular case may actually take one additional cycle to calculate a CRC and determine the existence of an error relative to the approach of FIGS. 2A-2B, the present invention realizes considerable savings in chip real estate and power consumption relative to the approach of FIGS. 2A-2B.

Where the transmitted data is known to consist of an integer number of data blocks and the transmitted/appended error checking code is one block long, the "back end padding" scheme of FIGS. 3A-C, works quiet well. There is also no need to know the length of the remainder before beginning the error checking calculation on the data, as long as one can determine it before selecting the padding vector (where applicable) and performing the error checking calculation on the last line. Where the remainder has a length less than that of a full data line, but greater than a full data line minus the transmitted CRC length (one case where the remainder does not consist of an integer number of blocks), one must use the data alignment architecture of FIG. 4B.

Figure 4A:
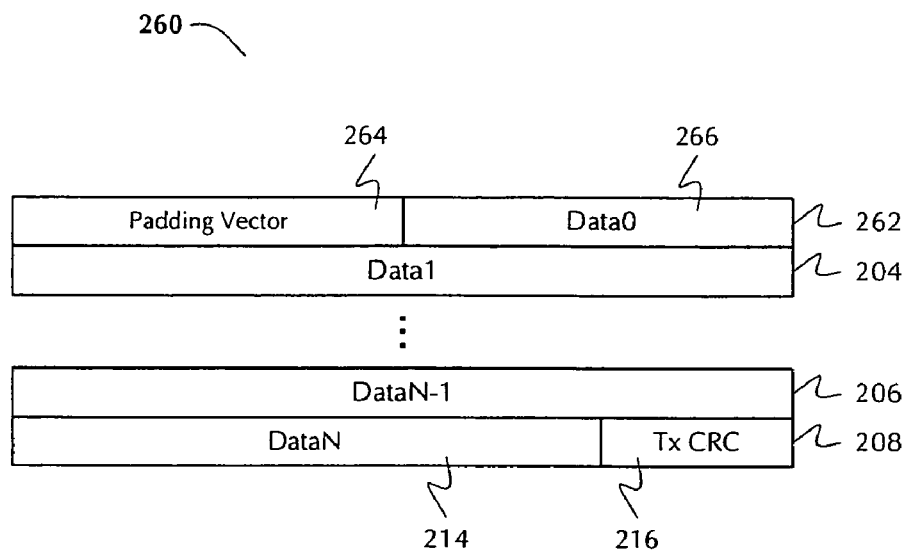
FIGS. 4A-4B are diagrams showing a second series of exemplary embodiments of the present data alignment architecture for calculating a CRC and determining whether there has been a transmission error.
Figure 4B:
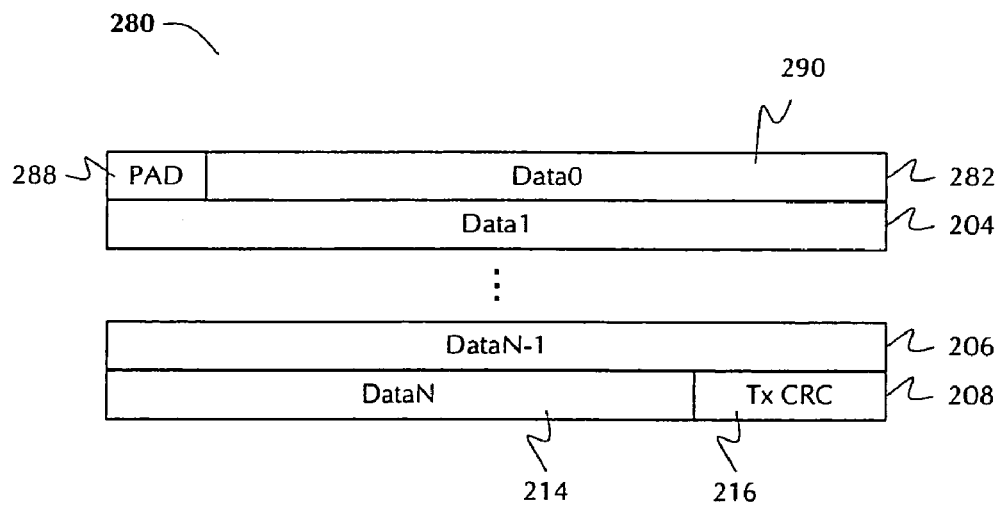

FIGS. 4A-4B show a data alignment architecture in which the first data line comprises a padding vector. This architecture is preferred when the reminder has a length of from greater than the full data line length minus the appended error checking code length to less than the full data line length, or that is a non-integer divisor of the data line length, although this embodiment is also suitable as a general alternative to the embodiment(s) of FIGS. 3A-3D.

For example, FIG. 4A shows a unit of digital data 260, comprising a first line 262, plurality of full data lines 204-206 and a last line 208. The full data lines 204-206 and last line 208 are essentially the same as in FIG. 3A, but first line 262 generally comprises a padding vector 264 and data portion 266 (e.g., "Data0"). Data portion 266 in this example generally can have a length of from one data bit to less than a full data line length. Like data portion 212 in FIG. 3A, data portion 266 represents the first portion of transmitted data, temporally and/or sequentially. Padding vector 264 generally has a length of a full data line length minus the length of data portion 266, typically from one data bit to q data blocks minus one bit (where q is as defined above).

While a padding vector of all zero bits is preferred in this embodiment not only because an iteration of an error checking code calculation on an "all zeros" block of data generally does not change the value of the overall error checking code calculation (particularly in a CRC calculation), but also "zero-padding" the beginning of the transmitted data does not change the value of the data vector for the error checking calculation. Furthermore, in the implementation of FIGS. 4A-4B, the padding vector may be any vector that, in combination with an appropriate initial vector, gives a known result or has a known computational change on the error checking code calculation.

Referring now to FIG. 4B, the unit of digital data 280 comprises a first line 282, a padded data line 284, a plurality of full data lines 204-206 and a last line 208. The full data lines 204-206 and last line 208 are essentially the same as in FIG. 4A, but first line 282 generally consists padding vector 288 (e.g., "PAD") and data portion 290 (e.g., "Data0"). Data portion 290 in this example generally has a length of from (i) greater than a full data line length minus the length of the appended CRC vector 216 to (ii) less than a full data line length. Padding vector 288 therefor has a length of at least one bit, but less than the length of the appended CRC vector 216.

FIG. 4B shows the value of "front-end" data padding when the remainder 290 (in this case, Data0) has a length that is not an integer multiple of the data block length. In this embodiment, the appended error checking code 216 has a length equal to that of the data block length. As a result, the iterated error checking code vector (see, e.g., CRCOUT in FIG. 5 and the corresponding discussion below) calculated or computed on each line of data also has a length equal to that of the data block length. Consequently, to ensure that the last iteration of the error checking calculation is performed on the appended error checking code (to thereby obtain a error checking result having a predetermined state), one may align the data so that the appended error checking code 216 is always at the temporal and/or sequential terminus in last line 208. As a result, to ensure that the value of the data vector does not change (and thus, that no changes are introduced into the corresponding value of the error checking code calculated thereon), one should pad the beginning, or "front end," of the data vector with a series of digital "zero" bits if one wishes to calculate error checking code on data lines that all have the same length. Thus, where the remainder can have a length of from one bit to less than the length of the transmitted CRC, the "front padding" embodiment of FIGS. 4A-B can be advantageous. However, the embodiment(s) of FIGS. 4A-B generally require that one know the length of the remainder before one can select the padding vector, and thus, begin the CRC calculation.

As mentioned above, padding a data remainder to provide data lines all having the same length is not a requirement of the invention. Where padding vectors are not inserted, one may employ a conventional error checking circuit such as that shown in FIG. 2B to calculate error checking code on the remainder. Also, the present invention does not exclude conventional comparisons of calculated error checking code with transmitted error checking code to determine whether a transmission error has occurred. In such a case, the present invention provides an extra level of reliability, in that it can be used to confirm that the conventional error determination is accurate.

In a further embodiment, the present method may further comprise (i) receiving the transmitted data and accompanying non-data information (a "transmitted information unit") and/ or (ii) removing the non-data portion(s) of the transmitted information unit (which may comprise removing the packet or frame header) and inserting a padding vector having a length equal to that of (1) a data line minus (2) the remainder (and where appropriate in the last line, the appended error checking code) for the packet header. In various embodiments where the transmitted data is part of a packet, the combination of at least two of (i) the remainder, (ii) the appended error checking code, and (iii) the padding vector has the same fixed length as each of the full data lines, and/or the checking step comprises checking each of the full data lines and the last line with a common error checking circuit.

In the present method, the error checking calculation may comprise any conventional (redundant) error checking process or technique, such as CRC, Hamming code or a "checksum" operation. Preferably, the error checking calculation comprises cyclic redundancy checking (CRC) operations. As is explained in greater detail below, an advantage of the present invention is that the error checking calculations may comprise calculating error checking code on each of the full data lines and the last line(s) with a common error checking circuit (preferably, a single CRC calculator). The present method may also further comprise acknowledging receipt of the transmitted data upon or in response to determining that there was on error in the data portions of the data (e.g., by issuing a conventional ACK command or signal when the CRC calculated from the data portions of the transmitted data matches the appended CRC), not acknowledging receipt and/ or requesting retransmission of the information upon or in response to determining that there was an error in the data portions of the information (e.g., by doing nothing or by issuing a conventional NAK [negative acknowledge] command or signal when the CRC calculated from the data portions of the transmitted data does not match the appended CRC), reassembling the data packet after the CRC calculation, etc.

Exemplary Circuits

A further aspect of the invention relates to a circuit for determining a data transmission error or for checking such an error determination, comprising (1) an error checking code calculation circuit configured to calculate error checking code on the transmitted data and the appended error checking code; (2) a vector selector configured to select one of a plurality of error checking vectors, the plurality of error checking vectors comprising an initial vector and an error checking code feedback vector; and (3) a logic circuit configured to determine a state of the calculated error checking code and, if the calculated error checking code has a predetermined state, indicate that there is no error in the transmitted data. Thus, the present circuit includes a means for calculating error checking code from (i) transmitted data and (ii) appended error checking code calculated on the transmitted data, a means for selecting one of a plurality of error checking vectors comprising an initial vector and an error checking code feedback vector; and a means for determining a state of the calculated error checking code and, if the calculated error checking code has a predetermined state, indicating that there is no error in the transmitted data.

FIG. 5 shows an exemplary CRC circuit 300, comprising CRC calculator block 310, data input 312, data output 320, CRC feedback loop 325 and multiplexer 316 providing an error checking vector at input 314. However, instead of a conventional $2^y$ bit-wide comparator for comparing a calculated CRC to a transmitted CRC, such as block 70 in FIG. 1B or block 170 in FIG. 2B, CRC circuit 300 includes a relatively simple output block 330, comprising demultiplexer 335 and error state determining circuit 340.

CRC calculator block 310 is configured as a single circuit that calculates a CRC on data having the same length (or width) as each of data lines 204 and 206, and is thus considered $2^m$ bits wide. Consequently, in this example, each of the first line, last line and any padded line that may be present is also configured to have the same length (or width) as each of data lines 204 and 206. CRC calculation block 310 thus performs a CRC calculation on $2^m$ bits of data (whether transmitted, selected or padded) in a single clock cycle. CRC calculator block 310 receives an error checking vector at input 314 and data (typically partitioned into lines or portions as described above) at input 312. After line-wise CRC calculations, the data (which typically includes any other vectors that have been added to the transmitted data for error checking calculations) are output onto data bus 320 (e.g., as the signal "DATA"), and the resultant CRC calculations are output onto error checking code loop 325, which is also an input into multiplexer 316 for possible feedback into CRC calculator block 310.

The operation of the CRC calculator 300 is as follows. Upon receiving an appropriate control signal (e.g., "CTRL[0:1]") from logic or a functional block elsewhere in the receiver indicating that a received data unit is about to be (or at last the first data portion of the unit [e.g., Data0 line 202 in FIGS. 3A-D] has been) transferred to CRC calculator block 310, an initial vector (e.g., "FIRST") is selected by multiplexer 316 and latched into CRC calculator block 310. The initial vector (e.g., "FIRST") is typically a series of all "ones" in digital or binary logic (e.g., 1111 . . . 1), but it can be any vector that provides a known state as a result of an error checking code calculation thereon (e.g., an "all ones" state, which is useful in many conventionally used CRC algorithms for storing a CRC calculation). A first data line (e.g., Data0 202 in FIGS. 3A-D) is also latched into CRC calculator block 310 in alignment with the initial vector, and a first CRC calculation is performed thereon in a first clock cycle. The calculated CRC is output on loop 325, which is selected for input into CRC calculator 310 by multiplexer 316 in response to an appropriate change in the multiplexer control signal CTRL[0:1]. Logic configured to generate appropriate states for the multiplexer control signal in accordance with the various data alignment schemes of FIGS. 3A-3D and FIGS. 4A-4B is well within the skills of those in the art.

Referring back to FIG. 5, in the second clock cycle, CRC calculator 310 receives a next full data line (e.g., Data1 204; see FIGS. 3A-3D) for a $2^m$ bit CRC calculation, which is then combined with the calculated CRC from the first clock cycle (an "iterated CRC") in accordance with conventional error checking calculation techniques, and the updated CRC calculation is output on loop 325. The iterated CRC is selected for input into CRC calculator 310 by multiplexer 316 until the appended error checking code (e.g., Tx CRC 216 in FIGS. 3A-3D) is input into CRC calculator 310. Depending on the length of the data remainder, multiplexer 316 may further select a padding vector PAD of appropriate length and latch it into CRC calculator block 310 in alignment with the appended error checking code, as shown in FIGS. 3B-3D. In one implementation, the padding vector may comprise a series of bits having a value of zero (a so-called "zero-pad vector"). However, the padding vector may have any value that has a known or predetermined effect on the outcome of the CRC calculation.

At that point, a demultiplexer control signal (e.g., CTRL2 in FIG. 5) changes state in response to error state determination logic, and demultiplexer 335 selects the final updated CRC calculation for input into error state determining circuit 340. The error state determination logic configured to generate an appropriate state for the demultiplexer control signal in accordance with the various data alignment schemes of FIGS. 3A-3C and FIGS. 4A-4B is also well within the skills of those in the art, and may comprise a counter or other logic configured to correlate the length of the received data with the state of the demultiplexer control signal. Error state determining circuit 340 receives the p-bit-wide error checking result as output by CRC calculator block 310, and determines its state. If the error checking result has a predetermined state, an error indicator signal (e.g., ERROR, which is generally a single-bit signal) will have a state indicating that there is no error in the received data. On the other hand, if the error checking result does not have a predetermined state, the error indicator signal will have a state (which may be a complementary state) indicating that there is an error.

In the example of the present invention using an "all ones" initial vector and an "all zeros" padding vector, a simple OR gate can determine the state of the error checking result. As explained above, if there is no error in the transmitted data as received, the CRC calculator will calculate an "all zeros" error checking result. Thus, when the calculated error checking result is all zeros, the OR gate 340 outputs a digital zero, or LOW logic state, which in this example, indicates no error in the received data. However, if the calculated error checking result includes any non-zero bits, the OR gate will output a non-zero (a "1" or HIGH state, in digital logic) error indicator signal, which in this example, indicates that there is an error (in the received data, in the appended error checking code, or in the error checking calculation performed on the received data, any of which may be reflective of an inherent unreliability in the transmitted data).

The CRC calculator of FIG. 5 is also suitable for error checking determinations using the "front padding" data alignment scheme of FIGS. 4A-4B. In such cases, the logic controlling multiplexer 316 is simply configured to select the padding vector at a different time in the calculation. However, to minimize processing delays and/or latency, one generally will need to know or determine the remainder length either before (e.g., a priori) or contemporaneously with receipt of the transmitted data in the data alignment scheme of FIGS. 4A-4B.

Figure 5A:
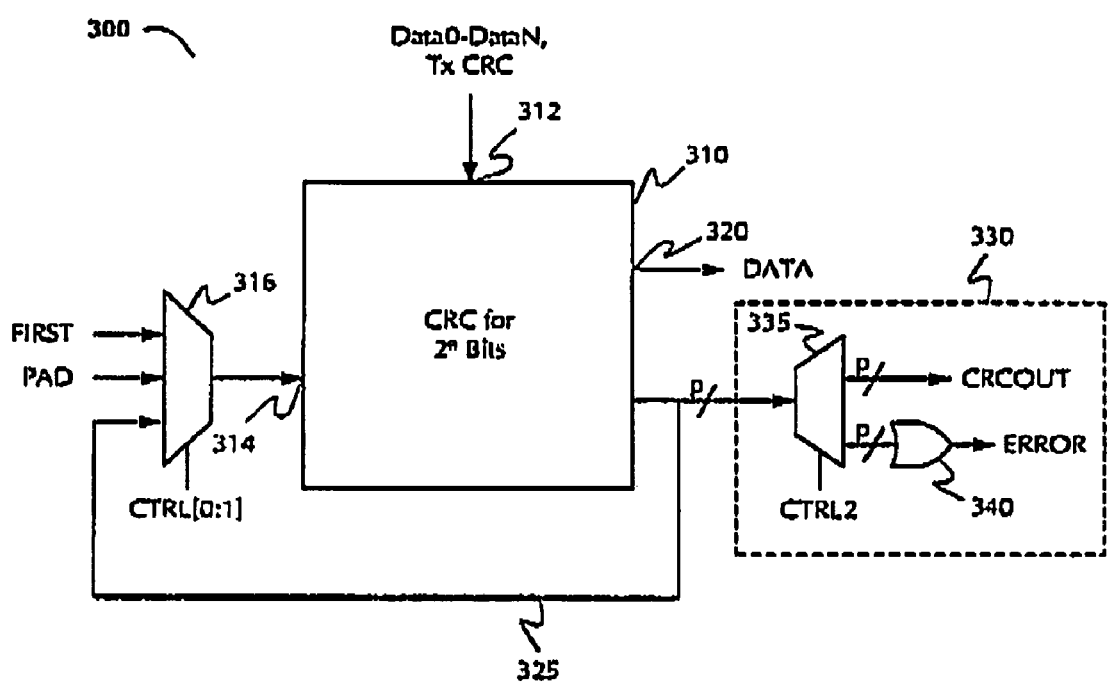
FIG. 5A is a diagram of an exemplary CRC circuit configured to practice the present invention.
Figure 5B:
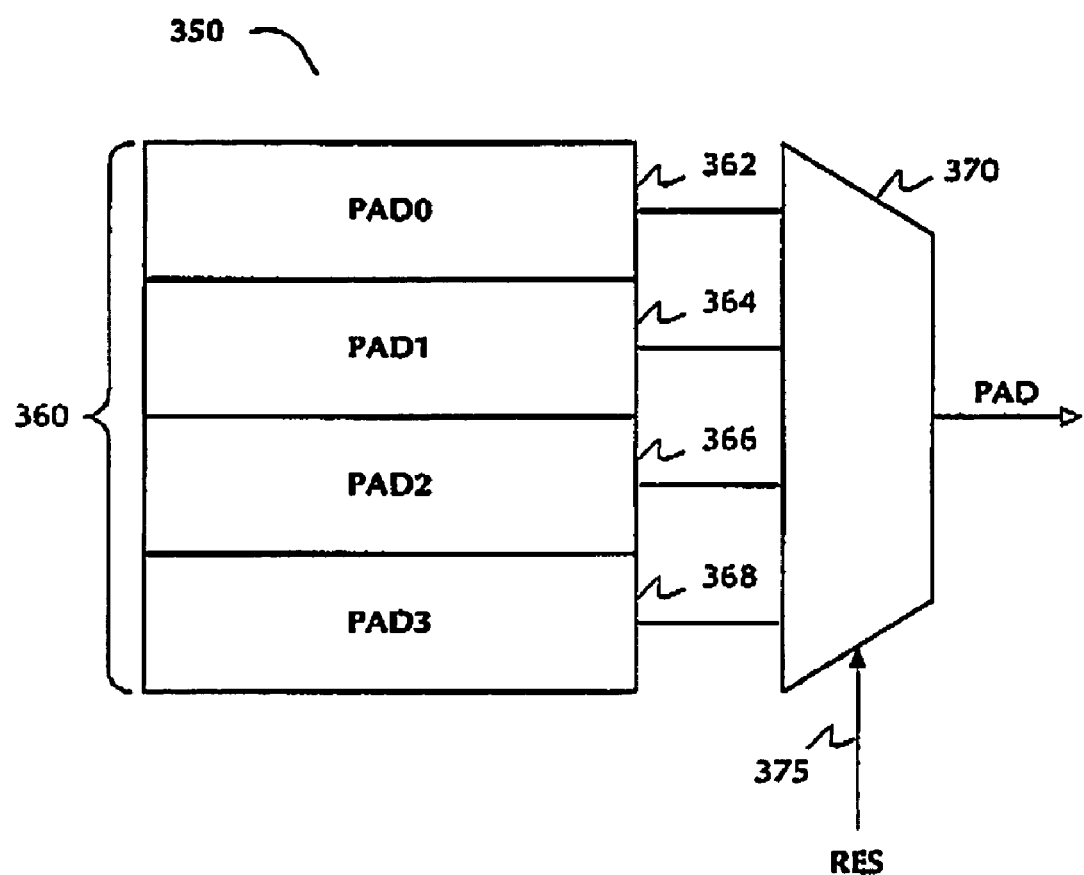
FIG. 5B is a diagram of an exemplary pad vector storage and selection circuit suitable for use in the present invention.

Thus, the plurality of error checking vectors in the present circuit may further comprise a padding vector (e.g., PAD in FIGS. 5A-5B). In such a circuit, the vector selector may be configured to insert the padding vector PAD either before the transmitted data or after the appended error checking code. In certain embodiments, the padding vector comprises a zero-pad vector (i.e., a vector consisting of bits having a digital value of zero). Also, as described in the exemplary method above, the plurality of error checking vectors may further comprise a set of padding vectors (and in one implementation, a plurality of zero-pad vectors), each having a unique length. Thus, in various embodiments, and referring now to FIG. 5B, the circuit may further comprise (i) a storage circuit 360 configured to store a set of padding vectors (e.g., PAD0:PAD3), in which each padding vector may have a unique length; and/or (ii) a padding vector selector (e.g., multiplexer 375), configured to select one of the padding vectors from the set. The storage circuit 360 may comprise a hash table or a look-up table 434 (see FIGS. 6-7). In further embodiments, and referring back to FIG. 5B, the padding vector selector 375 selects the one of the padding vectors in response to a remainder information signal RES 375, and a state of the remainder information signal RES 375 corresponds to a length of the remainder. The circuit may even further comprise a logic circuit configured to generate the remainder information signal. For further details as to such circuits and padding vector schemes, see copending application Ser. No. 10/794,496, filed on Mar. 3, 2004, the relevant portions of which are incorporated herein by reference.

The hash table or look-up table 360 may comprise an array of non-volatile data bit storage elements (e.g., mask- or laser-programmed ROM, EPROM, EEPROM or flash memory). The table 360 may have a series of addresses corresponding to unique padding vectors 362-368, or logic may be configured to choose one or more sections of a padding vector having a full line length (e.g., a one-line-long shift register stores a series of binary zeros, an appropriate length of which is shifted out in response to an instruction from the logic). However, an "all zeros" padding vector, while preferred, is not the only vector suitable for the present padding vector. Any other vector that, in combination with the predefined vector, can result in a known (and in a preferred embodiment, an "all ones") CRC calculation state is suitable.

In an "integer multiple of words" embodiment, logic elsewhere in the receiver may be configured to determine whether the unit of digital data includes a remainder, and if so, how many data words are in the remainder. Such logic may comprise a counter configured to count the number of bits, bytes or words of data in a transmitted information unit, or it may comprise a simple decoder that decodes appropriately designated "remainder length" information bits in the non-data information transmitted with the unit of data. Thus, the present method may further comprise the step(s) of determining whether the unit of digital data includes the remainder and/or determining the number of data blocks or words in the remainder.

The present circuit may further comprise a data partitioning circuit configured to partition the transmitted data line (i) one or more data lines having a fixed length (a "full data line"), and (ii) a last line comprising the appended error checking code. The last line generally further comprises a data remainder and/or a padding vector, in which the data remainder and/or padding vector have a length less than or equal to the first fixed length minus the length of the appended error checking code. Such circuits may further comprise a remainder logic circuit configured to generate a remainder information signal having a state corresponding to a length of the data remainder, and the vector selector may select one of the padding vectors in response to the remainder information signal. Further details as to such circuits and padding vector schemes may be found in copending application Ser. No. 10/794,496, filed on Mar. 3, 2004, the relevant portions of which are incorporated herein by reference.

As described above, the predetermined state of the error checking calculation result may comprise a block of digital bits, where each bit in the block has the same digital value, and the error determining logic circuit may further comprise a demultiplexer configured to output (i) error checking code calculated on the transmitted/received data or (i) the state of the calculated error checking code, depending on a control signal state.

As described above for the present method, in the present circuit, each of the full data lines, the first and last lines, and any padded data line may comprise $2^x$ data blocks, where x is an integer of from 1 to 4. Furthermore, each data block may have a fixed length of $2^n$ bits, where n is an integer of from 3 to 7, or from 4 to 6, and in one implementation, n is 5.

As for the method, in the present circuit, the transmitted data unit may comprise a portion of a conventional packet, frame or page, preferably a packet, and each of the data blocks may consist of a data word (e.g., n=5). Therefore, in preferred embodiments, the present circuit is configured such that each of the full data lines, the first and last lines, and any padded data line has a second fixed length, where the second fixed length is an integer multiple of the first fixed length. For example, the second fixed length may comprise or consists of $2^m$ bits, where in various embodiments, m is an integer of from 6 to 10 (e.g., 7 or 8). In one implementation, m is 7.

In another embodiment of the present circuit, the data partitioning circuit may comprise a deserializer (see FIGS. 6-8 and the discussion thereof below) and/or a plurality of data bit storage elements configured to store one or more of the plurality of data blocks. The plurality of data bit storage elements may comprise one or more rows, columns, banks, groups, series or arrays of flip-flops, latches or registers having a width equal to or a $1/2^x$ (where x is as defined above) divisor of the full data lines (e.g., the second fixed width above). See, e.g., Mano, "Digital Design," 3rd ed., Prentice Hall, Upper Saddle River, N.J. (2002), chapter 6, the relevant portions of which are incorporated herein by reference.

In a particularly preferred embodiment, the error checking code calculation circuit comprises a cyclic redundancy checking (CRC) circuit. As explained above, the full data lines, the first and last lines, and any padded data line generally have a common (i.e., the same) bit length. This feature enables a single CRC circuit to calculate a CRC on transmitted data units of any length, thereby reducing the chip area dedicated to CRC, increasing the utilization efficiency of the circuitry on the chip, and reducing power consumption. Thus, another preferred embodiment of the present circuit and/or architecture is one in which the error checking circuit comprises a cyclic redundancy checking (CRC) circuit. More preferably, the common bit length of each line is $2^m$ bits, where m is an integer of from 6 to 10 (e.g., 7 or 8).

Figure 1B:
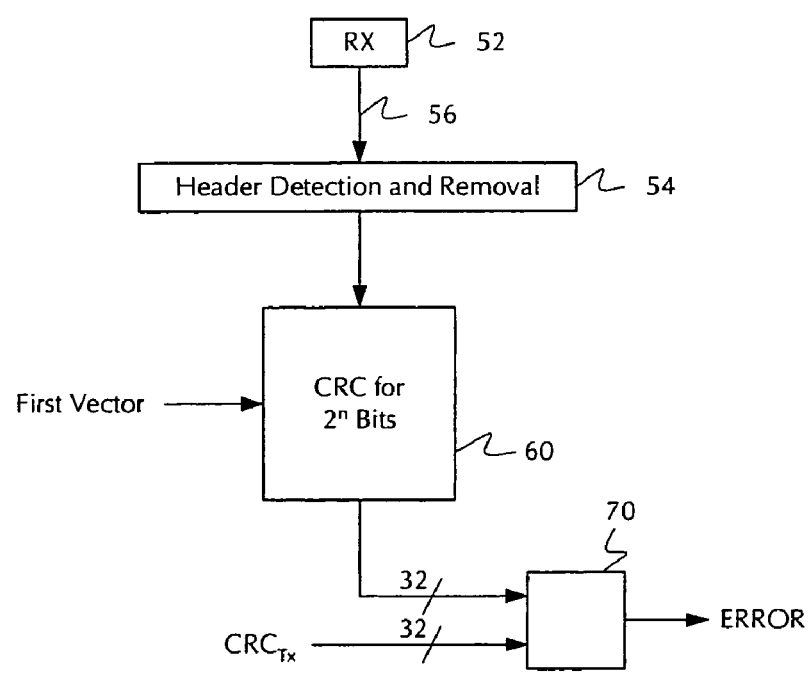
FIG. 1B is a block diagram showing conventional receiver circuitry for calculating a CRC on the data packet of FIG. 1A.
Figure 2B:
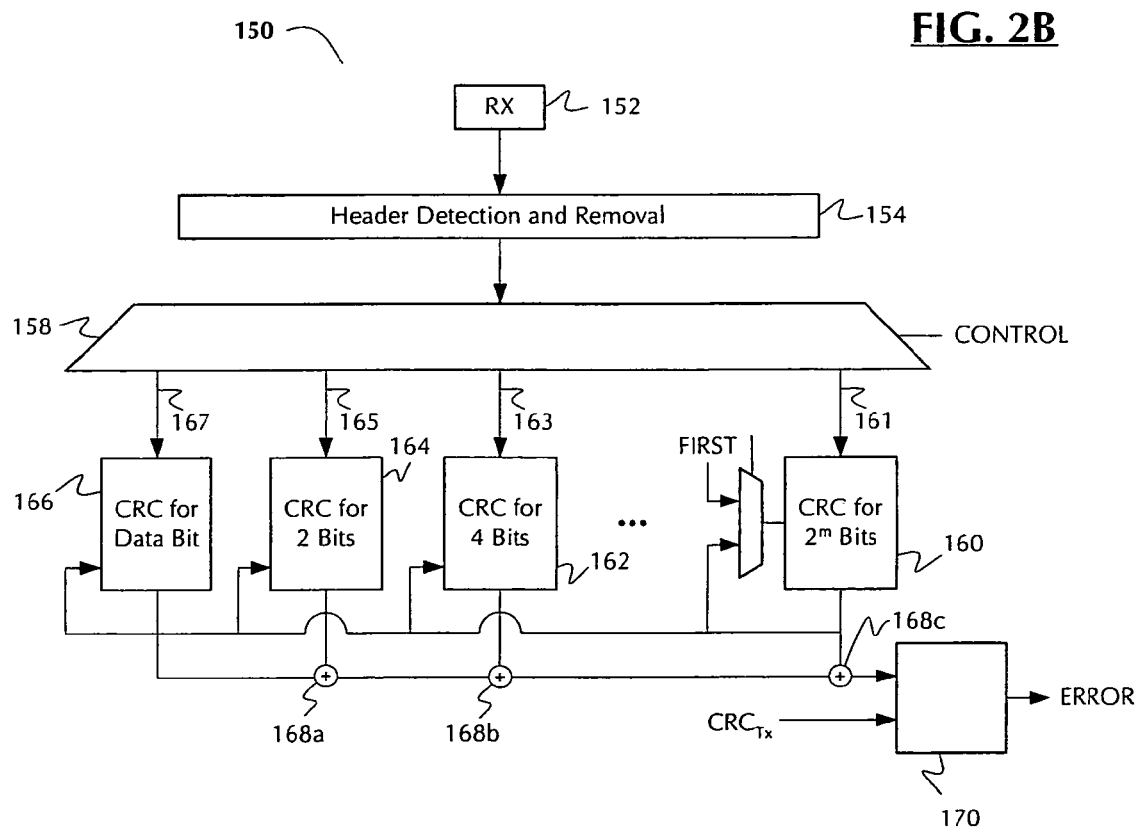
FIG. 2B is a block diagram showing receiver circuitry for calculating a CRC on the data packet of FIG. 2A.

Furthermore, the present circuit does not exclude a conventional comparator configured to compare calculated error checking code with transmitted error checking code to determine whether a transmission error has occurred, such as comparator 70 of FIG. 1B or comparator 170 of FIG. 2B. In such as case, the present invention provides an extra level of reliability, in that it can be used to confirm that the conventional error determination is accurate.

Exemplary Architectures

A further aspect of the invention relates to an architecture for determining an data transmission error, generally comprising the present circuit, and optionally, one or more additional functional blocks described herein and/or conventionally found or used in a receiver for digital data communications. As explained above, the full data lines, the first and last lines, and any padded data line generally have a common (i.e., the same) bit length. This feature enables a single CRC circuit to calculate a CRC on data of any length, thereby reducing the receiver chip area dedicated to CRC, increasing the utilization efficiency of the circuitry on the receiver, and reducing power consumption (both in the receiver and in a larger system that includes such a receiver). Thus, another preferred embodiment of the present circuit and/or architecture is one in which the error checking code calculation circuit comprises a cyclic redundancy checking (CRC) circuit. In various embodiments, the common bit length of the full data lines and the padded data line is $2^m$ bits, where m is an integer of from 6 to 10 (e.g., from 6 to 8). In one implementation, m is 7.

In a preferred application, the data received and/or processed by the present architecture is in the form of a plurality of packets. Preferably, each of the packets comprises (i) data partitionable into lines having a first fixed length, and (ii) a non-data portion comprising a packet header having a second length (which may be variable or fixed) less than or equal to the first fixed length. In preferred embodiments, the packet header has a fixed length, and the fixed length of the header is less than the length of the packet. The fixed length of the header may consist of $2^n$ bits, where n is an integer of from 3 to 8, preferably 4 to 7. In one implementation, n is 5.

Figure 6:
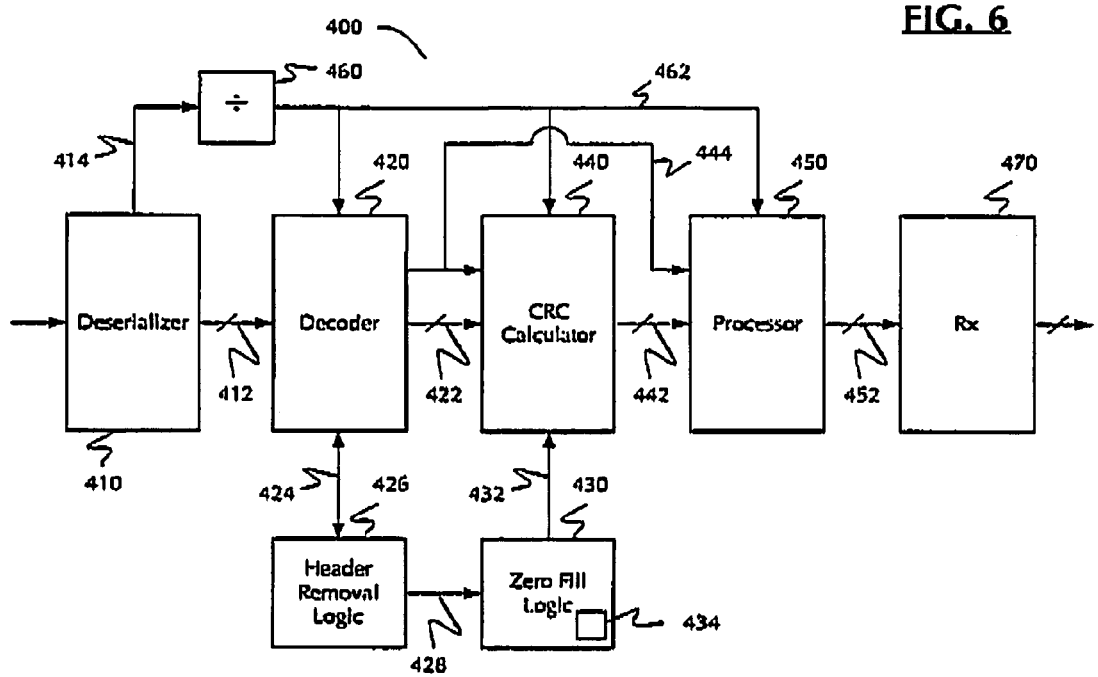
FIG. 6 is a box level diagram of an exemplary receiver architecture, embodying the present invention.

FIG. 6 shows a block diagram of an architecture and/or circuit suitable for use as a receiver implementing the present invention. Receiver 400 comprises a deserializer 410, a decoder 420, header removal logic 426, zero fill logic 430, CRC calculator 440, processor 450 and receiver functional block 470. Receiver 400 may further comprise a divider 460 configured to divide a clock signal recovered from serial information received by the receiver 400, typically by a clock recovery circuit located in the deserializer 410 (as shown in FIG. 6) or elsewhere in the receiver 400.

Deserializer 410 is generally configured to convert serial digital information received by the receiver 400 into parallel information for processing by downstream circuitry, such as decoder 420, header removal logic 426, zero-fill circuit 430 and CRC circuit 440. Thus, the present architecture may further comprise a deserializer configured to convert serial information into parallel information for processing by the non-data information detection circuit and the error checking code calculation circuit.

The present architecture may further comprise a decoder configured to decode at least part of the non-data information accompanying the unit of data. In certain embodiments, the non-data information comprises a header, and in other embodiments, a header and a trailer. For example, when the non-data information comprises a packet, the non-data information generally comprises a packet header, and when the non-data information comprises a frame, the non-data information generally comprises a frame header and a frame trailer.

As described above, in some applications, the header includes non-data information such as a start-of-packet (SOP) or start-of-frame (SOF) sequence, source and/or destination addresses, and/or information on the format and/or amount of data in the information block (e.g., packet or frame). The decoder is generally configured to perform a number of identification, detection and/or decoding functions, such as detect a SOP and/or SOF sequence, determine the format of the information block, determine the amount of data (e.g., in lines, words, bytes and/or bits) in the information block, and decode source and/or destination addresses. For example, referring to FIG. 6, decoder 420 may receive parallel information from deserializer 410 on bus 412 (which may be $2^p$ bits wide, where p is preferably an integer of from 2 to 7, more preferably of from 3 to 5), decode a destination address, then send an appropriate single- or multi-bit signal to receiver block 470 for appropriate routing of the information through receiver 400 towards the desired (e.g., predefined and/or predetermined) destination. The trailer typically contains an end-of-frame (EOF) sequence, and possibly information relating to the quality of the data (e.g., whether or not errors were identified in the data, what kind of error, and/or where the error may have been introduced), the priority of the information, the reliability of the data source, or other "tag" type of information relating to the quality and/or reliability of the data, its source and/or its transmission(s) through the network.

Upon detection of non-data information (e.g., a SOP or SOF sequence), decoder 420 also transmits an appropriate control signal to header removal block 426 along bus 424, which may be single-bit or multi-bit, bidirectional or comprised of two (or more) unidirectional busses. Header removal logic 246 sends a first control signal back to decoder 420 to not send non-data information to CRC calculation 440, and a second control signal along bus 428 (which may be single- or multi-bit, and is preferably multi-bit when zero fill logic 430 includes a look-up table 434) to zero fill logic 430, which then transmits to CRC calculator 440 (i) a padding vector of appropriate length and/or (ii) the known, predefined vector (e.g., first vector FIRST, discussed above with respect to FIG. 4) that may initiate the CRC calculation. Decoder 420, header removal logic 426 and/or zero fill logic 430 (preferably decoder 420) also sends to CRC calculator 440 a control signal configured to instruct CRC calculator 440 to select the appropriate vector from either parallel bus 422 (i.e., data portions 216 and 232-240 from decoder 420) or bus 432 (i.e., padding vector and/or the predefined vector from zero fill logic 430 or look-up table 434 therein) for the CRC calculation. Bus 432 may be serial or parallel.

Thus, the present circuit and/or architecture may further comprise (i) a second logic circuit configured to remove the non-data portion of the transmitted information and insert the padded data for the non-data portion, and/or (ii) a deserializer configured to convert serial information into parallel information for processing by the non-data information detection circuit and the error checking code calculation circuit, wherein the decoder is further configured to decode at least part of the parallel information. It is well within the abilities of one skilled in the art to design and use logic configured to remove from a serial or parallel data stream non-data information that has been identified as such, and insert the padded data (or any other vector, for that matter) for the non-data information.

CRC calculator 440 is configured to perform a conventional CRC operation, but generally on data having a single, uniform bit length (or, more literally, width, if performed on parallel data; see, e.g., exemplary CRC circuit 300 of FIG. 5 and the corresponding discussion thereof above). Thus, CRC calculator 440 typically includes only a single CRC calculating circuit configured to calculate a CRC on data of a fixed bit length/width, preferably where the fixed bit length/width is $2^n$ bits, where n is an integer of from 6 to 10 (e.g., from 6 to 8). CRC calculator 440 is also generally configured to determine whether the CRC it calculates matches the CEC transmitted with the information to receiver 400. Generally, in the implementation of FIG. 6, the (i) first and last lines, (ii) full data lines, (iii) any padded data line, and (iv) the CRC calculated by CRC calculator 440 are all output from CRC calculator 440 to processor 450 along parallel bus 442 either $2^p$ or $(2^p+1)$ bits at a time (where the extreme bit indicates whether the calculated CRC matches the transmitted CRC). A signal indicating whether the calculated CRC matches the transmitted CRC or not may also be sent from CRC calculator 440 to processor 450, or processor 450 may simply comprise logic circuitry configured to perform such as determination (e.g., comprising a conventional XOR or XNOR gate-based parity generator and/or parity checker; see, e.g., Mano, pp. 97-99, incorporated herein by reference).

The present architecture and/or architecture may further comprise a processor configured to process the data portions of the information received from the error checking code state determination circuit. Processor 450 is generally configured to perform any conventional data processing operation on either or both of the data portions and the non-data portions of the digital information, such as data filtering, signal equalizing, bit width adjusting, etc. In one embodiment, the processor is further configured to reassemble the packet header and the data portions of the information. In such an embodiment, the header information removed from the packet in decoder 420 will be transmitted to processor 450 on bus 444, which may be single- or multi-bit bus. In a further embodiment, the processor may be further configured to remove any appended error checking code from the transmitted (and/or received) data.

After processing the information received from CRC calculator 440 and/or decoder 420, the information is output on parallel bus 452 to receiver block 470. Receiver block 470 is conventional, and is generally configured to perform conventional receiver functions, such as data buffering, data signal routing, data signal switching, etc. When configured to buffer data, the receiver block 470 may comprise a conventional first-in-first-out (FIFO) memory or a conventional memory controller. When configured to route or switch data signals, the receiver block 470 may comprise a conventional switch array or crossbar array.

Figure 7:
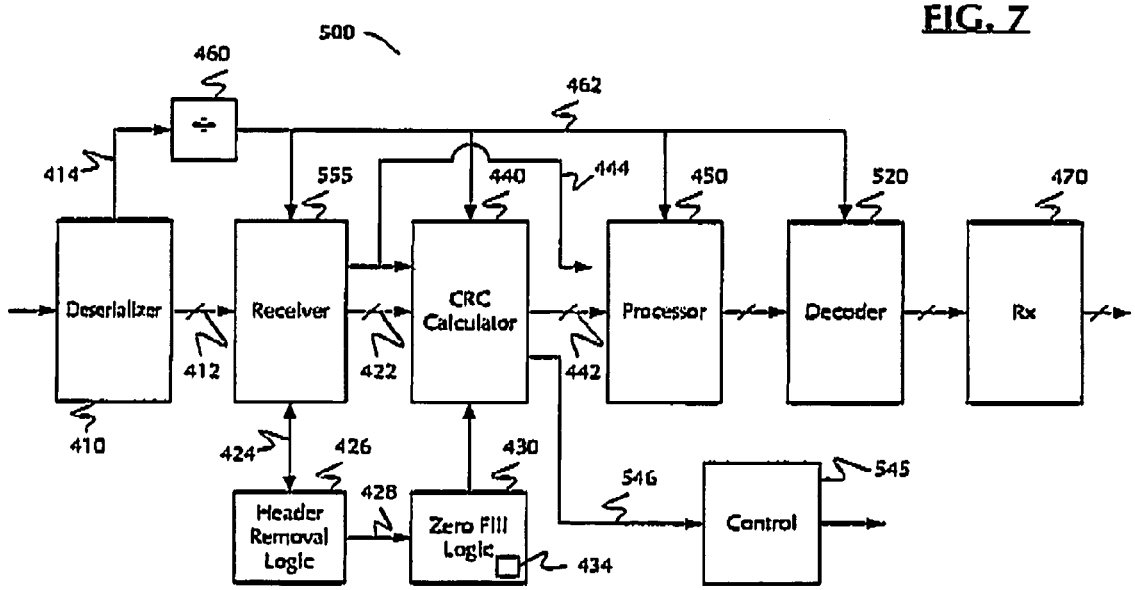
FIG. 7 is a box level diagram of a second exemplary receiver architecture, embodying the present invention.

FIG. 7 shows a second embodiment of a receiver architecture 500 configured to implement the present invention, with a few changes. Notably, decoder 520 is relocated downstream from processor 450, and thus, receives an output from processor 450 as an input. However, decoder 520 generally performs the same or similar functions as decoder 420 in FIG. 6, except for functions that are allocated to receiver block 555.

Receiver block 555 now receivers deserialized information on parallel bus 412 from deserializer 410. However, the function(s) of receiver block 555 are somewhat simplified relative to decoder 420 (see FIG. 6 and the description above). Receiver block 555 is generally configured to detect SOP and/or SOF sequences and/or CRC information, exchange information with and/or receive instruction(s) from header removal logic 426, remove non-data information from the data stream to enable CRC calculator 440 to perform a CRC calculation on the data, and transmit non-data information to processor 450. However, receiver block 555 generally does not decode certain information, such as source and destination addresses, information format and/or transmission protocol, etc. Such functions are generally reserved for the decoder 520.

FIG. 7 also includes a control lock 545 that receives information and/or instructions from CRC calculator 440 on bus 546 (which may be single- or multi-bit). In its simplest embodiment, CRC calculator 440 sends a single-bit status signal on bus 546 (e.g., the ERROR signal output by error state determining circuit 340 in FIG. 5) to control block 545, to indicate whether the calculated CRC matches the transmitted CRC (wherein the status signal has a first predetermined state) or not (wherein the status signal has a second predetermined state). In this embodiment, CRC calculator 440 further comprises logic circuitry configured to (i) determine whether the calculated CRC matches the transmitted CRC or not, and (ii) generate a signal indicating the result of such a determination.

When the calculated CRC matches the transmitted CRC, it is an indication that the error checking code calculation circuit and error state determining circuit detected no error in the transmitted data unit, and control block 545 may transmit one or more control signals to other circuitry, enabling such other circuitry to perform predefined functions and/or operations. When the calculated CRC does not match the transmitted CRC, it is an indication that the error checking code calculation circuit and/or the error state determining circuit detected an error in the transmitted data unit, and control block 545 may transmit one or more control signals (which may be discreet control signals or may be a different state of the same control signal) to other circuitry, either (i) disabling some or all of such other circuitry and/or (ii) instructing some or all of such other circuitry to perform one or more different predefined functions and/or operations.

Thus, in further embodiments, the present architecture may further comprise a control circuit configured to transmit a control signal in response to an error detected by the error checking circuitry. For example, the control circuit may be configured to transmit (i) a first control signal in response to the error checking circuitry determining an error state, and (ii) a second control signal in response to the error checking code state determination circuit indicating no error in the transmitted data. For example, control circuit 545 may (a) generate a conventional ACK signal and transmit the same to the external information transmitter to acknowledge receipt of the transmitted information in response to CRC calculator 440 determining that there was no error in the data (e.g., when the calculated CRC matches the transmitted CRC and/or when the output of error state determining circuit 340 indicates no transmission error); (b) do nothing or transmit a conventional NAK signal to the external information transmitter to indicate that the transmitted data may be corrupted and/or to request retransmission of the information in response to CRC calculator 440 determining that there was an error in the data (e.g., when the calculated CRC does not match the transmitted CRC and/or when the output of error state determining circuit 340 indicates that there is an error); (c) instruct processor 450 to reassemble the data packet after the CRC calculation and/or instruct receiver block 470 to buffer and/or route the data, etc.

Figure 8:
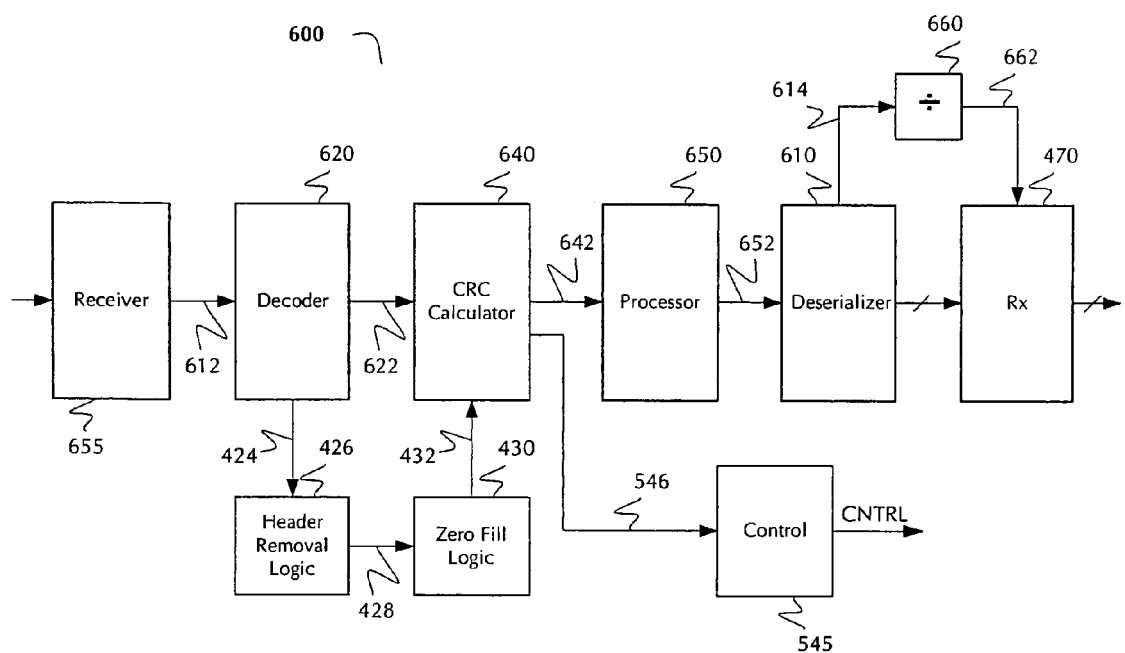
FIG. 8 is a box level diagram of a third exemplary receiver architecture, embodying the present invention.

FIG. 8 shows yet another embodiment of a receiver architecture 600 in which the decoder 620 may be configured to receive (and/or decode and/or otherwise process) serial information. This architecture is essentially the same as that of FIG. 7, but in which busses 612, 622, 642 and 652 are serial, rather than parallel, and in which decoder 620, CRC calculator 640 and processor 650 operate on serial data or serial information, rather than parallel data or parallel information. Such circuit blocks are conventional and known to those skilled in the art. However, it is worth noting again that serial CRC calculator 640 generally contains only a single CRC calculating circuit that operates on data lines having a uniform, consistent and/or common bit length.

Exemplary Software

Although the description herein tends to focus on methods and hardware (e.g., architectures, systems and/or circuits), the present invention also includes a computer program and/or software, implementable and/or executable in a general purpose computer or wordstation equipped with a conventional digital signal processor, configured to perform one or more steps of the method and/or one or more operations of the hardware. Thus, a further aspect of the invention relates to software that implements the above method and/or algorithm. For example, the invention may further relate to a computer program, computer-readable medium or waveform containing a set of instructions which, when executed by an appropriate signal processing device, is configured to perform the above-described method and/or algorithm. Preferably, in the present software and/or algorithm, the error checking calculations comprise cyclic redundancy check (CRC) calculations.

For example, the computer-readable medium may comprise any medium that can be read by a signal processing device configured to read the medium and execute code stored therein or therein, such as a floppy disk, CD-ROM, magnetic tape or hard disk drive. Such code may comprise object code, source code and/or binary code.

The waveform is generally configured for transmission through an appropriate medium, such as copper wire, a conventional network cable, a conventional optical data transmission cable, or even air or a vacuum (e.g., outer space) for wireless signal transmissions. The waveform and/or code are generally digital, and are generally configured for processing by a conventional digital data processor (e.g., a microprocessor, microcontroller, or logic circuit such as a programmable gate array, programmable logic circuit/device or application-specific [integrated] circuit).

Figure 11:
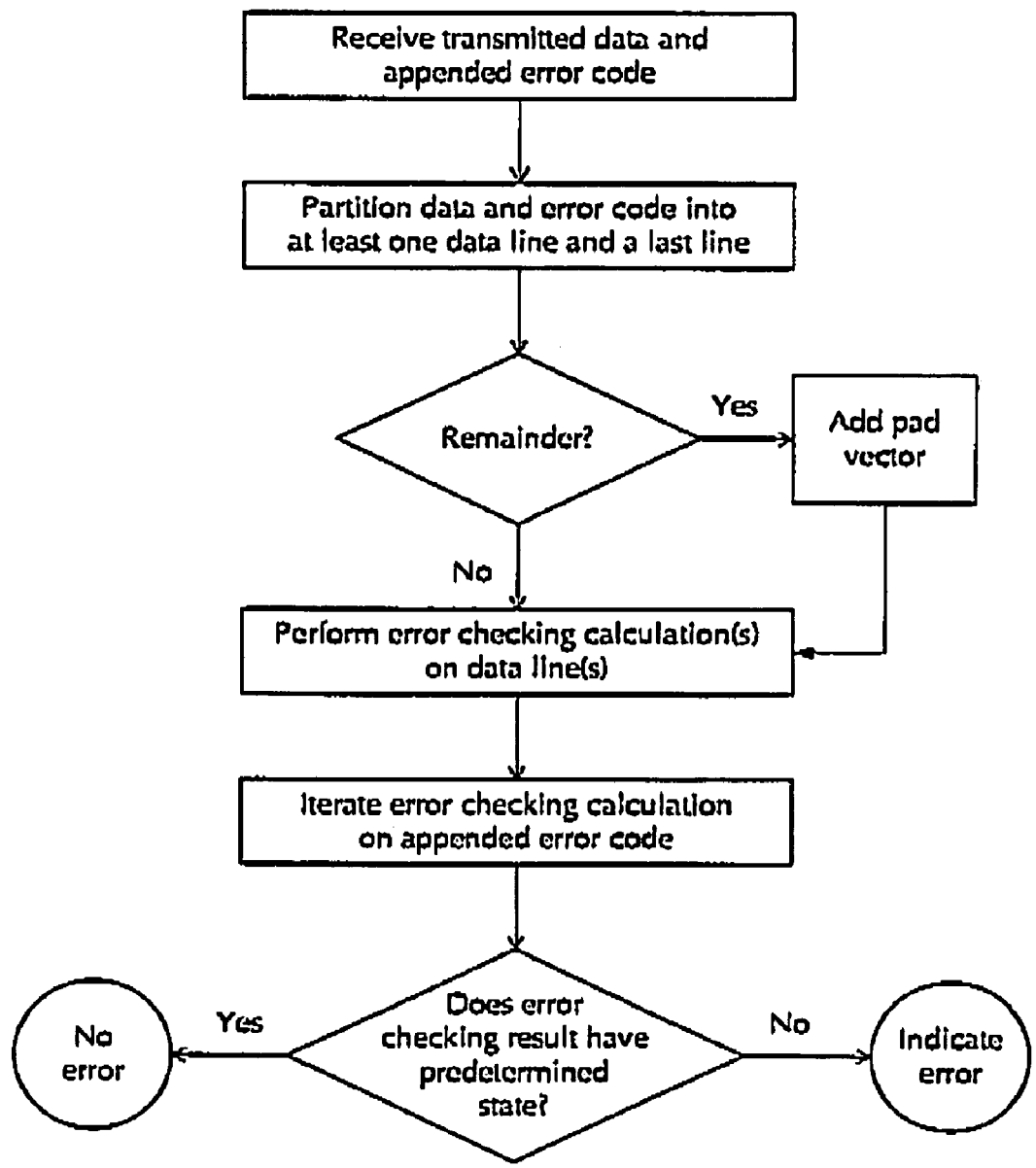
FIG. 11 is a flow chart for an exemplary computer-readable medium suitable for use in the present invention.

Thus, referring now to flow chart 900 in FIG. 11, in the present computer-readable medium or waveform, (i) the transmitted error checking code may have a length of p bits, where p is an integer of from 8 to 128, (ii) each of the one or more data lines and the last line has a fixed length, where the fixed length may comprise $2^n$ bits (where n is an integer of from 6 to 10), and/or (iii) the predetermined state of the error checking result is all zeros or all ones (see, e.g., decision 960). Furthermore, the set of instructions may further comprise one or more instructions to (1) partition the transmitted data and the transmitted error checking code into (i) one or more data lines and (ii) a last line comprising the transmitted error checking code (see step 920); (2) select a padding vector from a set of padding vectors (see, e.g., step 935), optionally in response to information comprising the length of the data remainder (see, e.g., decision 930); (3) insert the padding vector either in the last line or in a first data line of the one or more data lines (see, e.g., step 935); (4) determine a length of a data remainder in the last line (see, e.g., decision/step 930); (5) insert an initial vector at a beginning of a first data line of the one or more data lines; and/or (6) indicate that there is an error in the transmitted data if the calculated error checking result does not have the predetermined state (see, e.g., result 964).

The System and Network

A further aspect of the invention concerns a receiver, comprising the present circuit and/or architecture; comprising the present circuit, a processor in communication with the circuit, configured to process the transmitted data, and a clock recovery circuit configured to recover a clock signal from serial transmitted data received by the receiver. In preferred embodiments, the receiver is embodied on a single integrated circuit.

The data partitioning circuit in the present receiver may comprise a deserializer configured to convert serial digital data into parallel digital data for processing by the error checking code calculation circuit. Also, the processor may be further configured to assembly (i) non-data information from the packet or frame and (ii) at least part of the transmitted data. The present receiver may also further comprise a decoder configured to decode at least part of the non-data information.

In further embodiments, the receiver may further comprise a divider configured to divide the recovered clock. For example, each of FIGS. 6 and 7 show a divider 460 configured to receive a recovered clock 414 from deserializer 410 and provide a divided clock signal 462 to receiver functional blocks downstream from deserializer 410 (e.g., decoder 420, CRC calculator 440 and processor 450 in FIG. 6). FIG. 8 shows a similar divider 660, configured to receive a recovered clock 414 from deserializer 410 and provide a divided clock signal 462 to receiver functional blocks downstream from deserializer 410 (e.g., decoder 420, CRC calculator 440 and processor 450). The value by which a divider divides a recovered clock may be a fraction of any integer of 1 or more divided by any integer of 2 or more. Generally, the divided clock signal has a frequency suitable for operation of the downstream functional blocks (e.g., from 50 to 500 MHz, typically about 75, 83, 100, 125, 133, 166, 200, 233, 250 or 266 MHz).

In other embodiments of the present receiver, the processor (e.g., processor 450 in FIGS. 6-7 or 650 in FIG. 8) is configured to process the full data lines and the padded data line received from the error checking code state determination circuit; the processor is further configured to assemble (i) non-data information from the packet or frame and (ii) at least part of the digital data; the data partitioning circuit comprises a deserializer (e.g., deserializer 410 in FIGS. 6-7 or 620 in FIG. 8) configured to convert serial digital data into parallel digital data for processing by the error checking code state determination circuit; and/or the receiver further comprises (a) a decoder (e.g., decoder 420 in FIG. 6, decoder 520 in FIG. 7 or decoder 620 in FIG. 8) configured to decode at least part of the non-data information and/or (b) a logic circuit configured to (i) receive the padded data line from the error checking code state determination circuit and (ii) remove the padding vector from the padded data line the error checking code state determination circuit comprises a cyclic redundancy checking (CRC) circuit.

As for other aspects of the present invention, the unit of transmitted data received and/or processed by the present receiver may comprise a packet or frame; each of the data blocks may comprise or consist of a data word (where the data blocks comprise a data word, the data word may further include one or more parity bits); and/or each of the full data lines, the first and last lines, and any padded data line has a second fixed length, and the second fixed length is an integer multiple of the first fixed length (and preferably, the second fixed length consists of $2^m$ bits, where m is an integer of from 6 to 10).

A further aspect of the present invention relates to a system for transferring data on or across a network, comprising the present receiver, at least one transmitter in communication with the receiver, the transmitter being configured to transmit the transmitted data to the receiver, and at least one receiver port in communication with the receiver for receiving the transmitted data. The transmitter in the present system may further comprise (i) a CRC generator configured to generate CRC information from the transmitted data and (ii) a transmitter processor configured to append the CRC information to the transmitted data. The system itself may further comprise a control bus configured to transmit an indicator signal from the receiver to the transmitter, the indicator signal indicating whether there is an error in the transmitted data. Furthermore, the receiver may further comprise a control circuit configured to generate a control signal in response to the error state determining circuit indicating at least one of an error in the transmitted data and/or no error, and the system may further comprise a control bus configured to transmit the control signal from the receiver to the transmitter.

Figure 9:
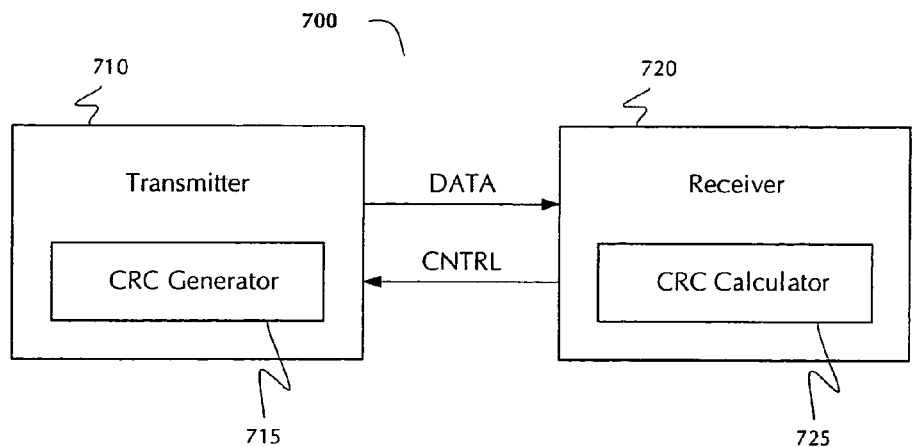
FIG. 9 is a box level diagram of an exemplary system configured to employ the present invention.

For example, and referring now to FIG. 9, a system 700 implementing the present invention may comprise a transmitter 710, a receiver 720, and at least two busses therebetween: (1) a serial information transmission bus DATA from transmitter 710 to receiver 720, and (2) a unidirectional control bus CNTRL from receiver 720 to transmitter 710. While the serial information bus DATA is generally single bit and unidirectional, control bus CNTRL may be single bit or multi-bit, and may be serial or parallel. As is known to those skilled in the art, transmitter 710 further includes a CRC generator 715, which generally comprises a conventional CRC calculating circuit (and which may comprise the error checking code state determination circuit described above) and a further circuit configured to append or insert a CRC generated on a unit of data by CRC generator 715 to the unit of data to be transmitted by transmitter 710 to receiver 720. Similarly, receiver 720 (which generally comprises the receiver circuitry and/or architecture described above) further includes a CRC calculator 725, which generally comprises the error checking code state determination circuit described above and further circuitry configured to remove the CRC generated by CRC generator 715 and compare it to the CRC calculated by the error checking code state determination circuit in CRC calculator 725. As described above, depending on whether the calculated CRC matches the generated CRC, a control signal (e.g., CNTRL) may be transmitted to transmitter 710 to either acknowledge receipt of an uncorrupted data unit (calculated CRC matches) or request retransmission of corrupted data (calculated CRC does not match). Thus, in preferred embodiments of the present system, the transmitter further comprises (i) a CRC generator configured to calculate CRC information, and/or (ii) a transmitter processor configured to (a) append the CRC to the data to be transmitted and/or (b) add CRC information to or insert the CRC information in the non-data information accompanying the data to be transmitted. Likewise, the receiver may further comprise a control circuit configured to generate the control signal in response to the error state determining circuit determining (i) an error in the transmitted data and/or (ii) no error. Furthermore, the system may further comprise a control bus configured to transmit the control signal from the receiver to the transmitter.

In further embodiments, the system may be configured to convert serial data from the network to parallel data for a device, and convert parallel data from the device to serial data for the network. Thus, the system may further include (1) a deserializer as described above, included in the receiver; (2) a serializer (included in the transmitter) configured to convert parallel information from a device inclining the transmitter to serial information for a network; (3) a decoder as described above, included in the receiver; (4) an encoder (included in the transmitter) configured to encode certain non-data information and append or insert such encoded information to the information to be transmitted onto a network; (5) a data processor in the receiver as described above; and/or (6) a receiver functional block as described above. In a preferred implementation, the receiver in the system further comprises a second transmitter (i.e., the receiver is a transceiver or part of a multiplexer, network switch, repeater, router or SERDES device).

Figure 10:
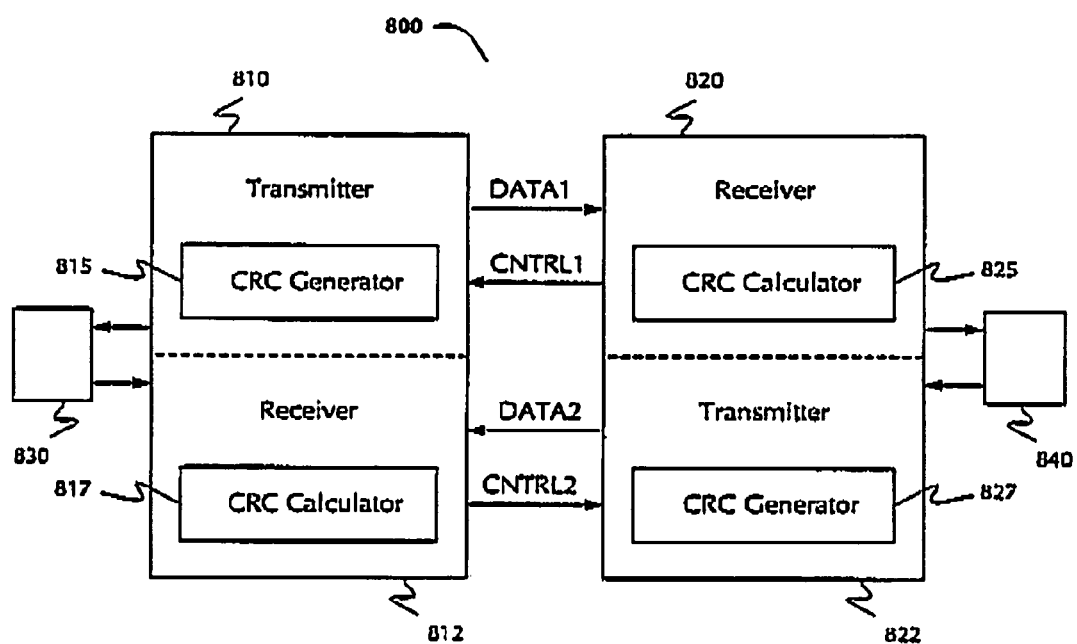
FIG. 10 is a diagram of an exemplary network comprising a plurality of the exemplary systems of FIG. 9.

Referring now to FIG. 10, a still further aspect of the present invention relates to a network 800, comprising a plurality of the present systems (e.g., 810-812 and 820-822), in communication with each other, and a plurality of storage or communications devices (e.g., 830 and 840), wherein each of the storage or communications devices is in communication with at least one of the systems. The network may be any kind of known network, such as a storage network (e.g., RAID array), Ethernet, or wireless network, and the network may include any known storage or communications device.

CONCLUSION/SUMMARY

Thus, the present invention provides a method, circuit, architecture, and system for detecting or determining an error in a data transmission. The method generally comprises (1). The circuit and architecture generally comprise (a). In one embodiment, the data lines and the last line have a common, fixed bit length. This feature enables a single error checking code calculation circuit to calculate redundant code (such as a CRC, Hamming code or a checksum) on data of any length, thereby further reducing the chip area dedicated to error detection, further increasing the utilization efficiency of the circuitry on the chip, and further reducing power consumption.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of determining or confirming an error in transmitted data, comprising the steps of:
   a) receiving said transmitted data and then partitioning said received data into at least one data line and a last line, each of said at least one data line and said last line having a first fixed length, and the last line containing appended error checking code calculated on said transmitted data;
   b) when said partitioned received data has a remainder, said remainder having any length less than said first fixed length and greater than zero, appending a pad vector to said remainder, the pad vector having a length sufficient to form a first data line with said first fixed length when the pad vector is appended to said remainder;
   c) performing an error checking calculation on said first line, said at least one data line and any data in said last line to generate an error checking vector;
   d) iterating the error checking calculation on said appended error checking code using said error checking vector to provide a calculated error checking result;
   e) determining a state of said calculated error checking result; and
   f) if said calculated error checking result has a predetermined state, indicating that there is no error in said transmitted data.

2. The method of claim 1, wherein said one or more data lines each comprise a plurality of data blocks, each data block having a second fixed length, said second fixed length being an integer divisor of said first fixed length, and said appended error checking code has a third length comprising an integer multiple of said second fixed length, said integer multiple being the same as or less than said integer divisor.

3. The method of claim 1, wherein said first fixed length comprises $2^m$ bits, where m is an integer of from 6 to 10.

4. The method of claim 1, wherein said step of performing an error checking calculation comprises checking each of said first line, said at least one data line and said last line with common error checking circuitry.

5. The method of claim 1, wherein said predetermined state is selected from the group consisting of all zeros and all ones.

6. The method of claim 1, wherein if said calculated error checking result does not have said predetermined state, indicating that there is an error in said transmitted data.

7. The method of claim 1, wherein said appended error checking code has a length of p bits, where p is an integer of from 8 to 128.

8. The method of claim 7, wherein p is 8, 16, 32, 64 or 128.

9. The method of claim 1, wherein performing said error checking calculation on said first line, said at least one data line and any data in said last line comprises a plurality of cyclic redundancy check (CRC) calculations.

10. The method of claim 9, wherein said appended error checking code comprises a CRC calculation result on said transmitted data.

11. The method of claim 9, wherein iterating the error checking calculation on said appended error checking code comprises a CRC calculation on said appended error checking code.

12. A computer-readable medium containing a set of instructions which, when executed by a signal processing device configured to execute computer-readable instructions, is configured to cause a receiver circuit to perform the method of claim 1.

13. The computer-readable medium of claim 12, wherein said transmitted error checking code has a length of p bits, where p is an integer of from 8 to 128.

14. The computer-readable medium of claim 12, wherein said fixed length comprises $2^m$ bits, where m is an integer of from 6 to 10.

15. The computer-readable medium of claim 12, wherein said error checking calculations comprise cyclic redundancy check (CRC) calculations.

16. The computer-readable medium of claim 12, wherein said predetermined state is selected from the group consisting of all zeros and all ones.

17. The computer-readable medium of claim 12, wherein said set of instructions further comprises an instruction to indicate that there is an error in said transmitted data if said calculated error checking result does not have said predetermined state.

18. The computer-readable medium of claim 12, wherein said set of instructions further comprises an instruction to select the pad vector from a set of padding vectors.

19. The computer-readable medium of claim 18, wherein said pad vector is a zero-pad vector.

20. The computer-readable medium of claim 12, wherein said set of instructions further comprises an instruction to determine a length of said remainder.

21. The computer-readable medium of claim 20, wherein said pad vector is selected in response to information comprising said length of said remainder.

22. A circuit for determining a data transmission error and/or checking a data transmission error determination, comprising:
   a) a data partitioning circuit configured to receive transmitted data and an appended error checking code calculated on said transmitted data, and then partition said transmitted data and said appended error checking code into at least one data line having a first fixed length and a last line comprising said appended error checking code and having said first fixed length;
   b) an error checking code calculation circuit configured to perform error checking calculations on a first data line, said at least one data line and any data in said last line to generate an error checking vector, and iterate the error checking calculation on said appended error checking code using said error checking vector to provide a calculated error checking result;
   c) a vector selector configured to insert a pad vector to said first data line when said partitioned transmitted data and appended error checking code comprises a remainder, said remainder having any length less than said first fixed length and greater than zero, and select one of a plurality of error checking vectors, said plurality of error checking vectors comprising an initial vector and an error checking code feedback vector, the pad vector having a length providing said first data line with said first fixed length when appended to said remainder; and
   d) a logic circuit configured to determine a state of said calculated error checking result and, if said calculated error checking result has a predetermined state, indicate that there is no error in said transmitted data.

23. The circuit of claim 22, wherein said pad vector comprises a zero-pad vector.

24. The circuit of claim 22, wherein said set of pad vectors comprises a plurality of zero-pad vectors, each having a unique length.

25. The circuit of claim 22, wherein said first fixed length is $2^m$ bits, where m is an integer of from 6 to 10.

26. The circuit of claim 22, wherein said transmitted data comprises a packet or frame.

27. The circuit of claim 22, wherein said error checking code calculation circuit comprises a cyclic redundancy checking (CRC) circuit.

28. The circuit of claim 22, wherein said predetermined state comprises a block of digital bits, where each bit in the block has the same digital value.

29. The circuit of claim 22, wherein said logic circuit further comprises a demultiplexer configured to output transmitted data error checking code calculated on said transmitted data or said state of said calculated error checking code, depending on a control signal state.

30. The circuit of claim 22, further comprising a storage circuit configured to store said set of pad vectors.

31. The circuit of claim 30, wherein said storage circuit comprises a hash table or a look-up table.

32. The circuit of claim 22, further comprising a remainder logic circuit configured to generate a remainder information signal having a state corresponding to a length of said remainder.

33. The circuit of claim 32, wherein said vector selector selects said one of said pad vectors in response to said remainder information signal.

34. A receiver, comprising:
   a) the circuit of claim 22;
   b) a processor in communication with said circuit, configured to process said transmitted data; and
   c) a clock recovery circuit configured to recover a clock signal from serial transmitted data received by said receiver.

35. The receiver of claim 34, embodied on a single integrated circuit.

36. The receiver of claim 34, wherein said data partitioning circuit comprises a deserializer configured to convert serial digital data into parallel digital data for processing by said error checking code calculation circuit.

37. The receiver of claim 34, wherein said transmitted data comprises a packet or frame.

38. The receiver of claim 37, wherein said processor is further configured to assemble (i) non-data information from said packet or frame and (ii) at least part of said transmitted data.

39. The receiver of claim 38, further comprising a decoder configured to decode at least part of said non-data information.

40. A system for transferring data on or across a network, comprising:
   a) the receiver of claim 34;
   b) at least one transmitter in communication with said receiver, said transmitter being configured to transmit said transmitted data to said receiver; and
   c) at least one receiver port in communication with said receiver for receiving said transmitted data.

41. The system of claim 40, further comprising a control bus configured to transmit an indicator signal from said receiver to said transmitter, said indicator signal indicating whether there is an error in said transmitted data.

42. The system of claim 40, wherein said error checking code calculation circuit comprises a cyclic redundancy checking (CRC) circuit.

43. The system of claim 42, wherein said transmitter further comprises (i) a CRC generator configured to generate CRC information from said transmitted data and (ii) a transmitter processor configured to append said CRC information to said transmitted data.

44. A network, comprising:
a) a plurality of the systems of claim 40, in communication with each other; and
b) a plurality of storage or communications devices, each of said storage or communications devices being in communication with one of said systems.

45. The network of claim 44, wherein said plurality of storage or communications devices comprises a plurality of storage devices.

46. A circuit for determining a data transmission error and/or confirming an error determination, comprising:
a) means for receiving and then partitioning said transmitted data and said appended error checking code into (i) at least one data line having a first fixed length, and (ii) a last line comprising said appended error checking code and having said first fixed length;
b) means for performing error checking calculations on a first data line, said at least one data line and any data in said last line to generate an error checking vector, and iterating the error checking calculation on said appended error checking code using said error checking vector to provide a calculated error checking result;
c) means for selecting one of a plurality of error checking vectors, said plurality of error checking vectors comprising an initial vector, an error checking code feedback vector, and a pad vector;
d) means of inserting said pad vector to said first data line when said partitioned transmitted data and said appended error checking code comprises a remainder, said remainder having any length less than said first fixed length and greater than zero, said pad vector having a length providing said first data line with said first fixed length when appended to said remainder; and
e) means for determining a state of said calculated error checking result and, if said calculated error checking result has a predetermined state, indicating that there is no error in said transmitted data.

47. The circuit of claim 46, wherein said pad vector comprises a zero-pad vector.

48. The circuit of claim 46, wherein said set of pad vectors comprises a plurality of zero-pad vectors, each having a unique length.

49. The circuit of claim 46, further comprising a means for storing said set of pad vectors.

50. The circuit of claim 46, wherein said fixed length is $2^m$ bits, where m is an integer of from 6 to 10.

51. The circuit of claim 46, wherein said transmitted data comprises a packet or frame.

52. The circuit of claim 46, wherein said means for calculating error checking code comprises a cyclic redundancy checking (CRC) circuit.

53. The circuit of claim 46, wherein said predetermined state comprises a block of digital bits, where each bit in the block has the same digital value.

54. The circuit of claim 46, wherein said means for determining and indicating further comprises a means for outputting (i) error checking code calculated on said transmitted data by said means for calculating or (ii) said state of said calculated error checking code.

55. The circuit of claim 46, further comprising a means for generating a remainder information signal having a state corresponding to a length of said remainder.

56. The circuit of claim 55, wherein said means for selecting selects said one of said pad vectors in response to said remainder information signal.

57. A receiver, comprising:
a) the circuit of claim 46;
b) a means for processing in communication with said circuit, configured to process said transmitted data; and
c) a means for recovering a clock signal from serial data received by said receiver.

58. The receiver of claim 57, embodied on a single integrated circuit.

59. The receiver of claim 57, further comprising a means for dividing said recovered clock.

60. The receiver of claim 57, wherein said means for calculating error checking code comprises a means for calculating cyclic redundancy code.

61. The receiver of claim 57, wherein said transmitted data comprises a packet or frame.

62. The receiver of claim 61, wherein said means for processing comprises a means for assembling (i) non-data information from said packet or frame and (ii) said transmitted data.

63. The receiver of claim 62, further comprising a means for decoding at least part of said non-data information.

64. A system for transferring data on or across a network, comprising:
a) the receiver of claim 57;
b) a means for transmitting said transmitted data and said appended error checking code to said receiver; and
c) at least one means for receiving said transmitted data and said appended error checking code, said means for receiving being in communication with said receiver.

65. The system of claim 64, wherein said means for transmitting further comprises (i) a second means for calculating error checking code on said transmitted data and (ii) a means for appending said error checking code to said transmitted data.

66. The system of claim 64, wherein said receiver further comprises a means for generating an indicator signal in response to at least one of (i) an error in said transmitted data and/or said appended error checking code and (ii) no error in said transmitted data and/or said appended error checking code detected by said means for calculating.

67. A network, comprising:
a) a plurality of the systems of claim 64, in communication with each other; and
b) a plurality of means for storing or means for communicating data, each of said means for storing or means for communicating data being in communication with at least one of said systems.

68. The network of claim 67, wherein said plurality of means for storing or means for communicating data comprises a plurality of means for storing.

* * * * *